(12) United States Patent
Lin et al.

(10) Patent No.: US 12,051,481 B1
(45) Date of Patent: Jul. 30, 2024

(54) AUTOMATIC TRACKING FOR CLOCK SYNCHRONIZATION BASED ON DELAY LINE ADJUSTMENT

(71) Applicant: Synopsys, Inc., Sunnyvale, CA (US)

(72) Inventors: David Lin, Westborough, MA (US); Kuan Zhou, Newton, MA (US)

(73) Assignee: SYNOPSYS, INC., Sunnyvale, CA (US)

( * ) Notice: Subject to any disclaimer, the term of this patent is extended or adjusted under 35 U.S.C. 154(b) by 18 days.

(21) Appl. No.: 18/076,981

(22) Filed: Dec. 7, 2022

Related U.S. Application Data

(60) Provisional application No. 63/286,794, filed on Dec. 7, 2021.

(51) Int. Cl.
  *G06F 1/12* (2006.01)
  *G11C 7/10* (2006.01)
  *G11C 11/4076* (2006.01)

(52) U.S. Cl.
  CPC .............. *G11C 7/10* (2013.01); *G06F 1/12* (2013.01); *G11C 7/1003* (2013.01); *G11C 7/1006* (2013.01); *G11C 11/4076* (2013.01)

(58) Field of Classification Search
  CPC ..... G06F 1/12; G06F 1/10; G06F 1/08; G11C 11/4076
  See application file for complete search history.

(56) References Cited

U.S. PATENT DOCUMENTS

| | | | |
|---|---|---|---|
| 6,691,214 B1* | 2/2004 | Li | G11C 7/1078 713/400 |
| 2014/0281662 A1* | 9/2014 | Gopalan | G06F 11/0793 714/3 |
| 2018/0137901 A1* | 5/2018 | Jung | G11C 7/1093 |

\* cited by examiner

*Primary Examiner* — Stefan Stoynov
(74) *Attorney, Agent, or Firm* — Lewis Roca Rothgerber Christie LLP

(57) ABSTRACT

A method includes: receiving a data signal (DQ) and a clock signal (DQS); generating an indicator signal by: delaying the data signal (DQ) to generate a delayed data signal (DQ'); sampling the data signal (DQ) and the delayed data signal (DQ') using an edge of the clock signal (DQS) to generate a first sampled value and a second sampled value; and generating the indicator signal based on the first sampled value and the second sampled value; and adjusting one or more of a DQ adjustable delay line associated with the data signal (DQ) and a DQS adjustable delay line associated with the clock signal (DQS) based on the indicator signal to synchronize the data signal (DQ) and the clock signal (DQS).

20 Claims, 22 Drawing Sheets

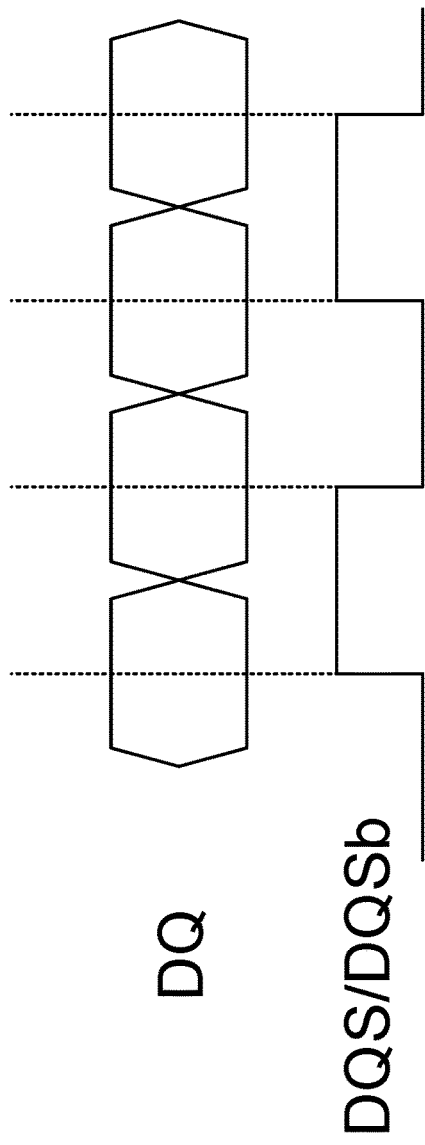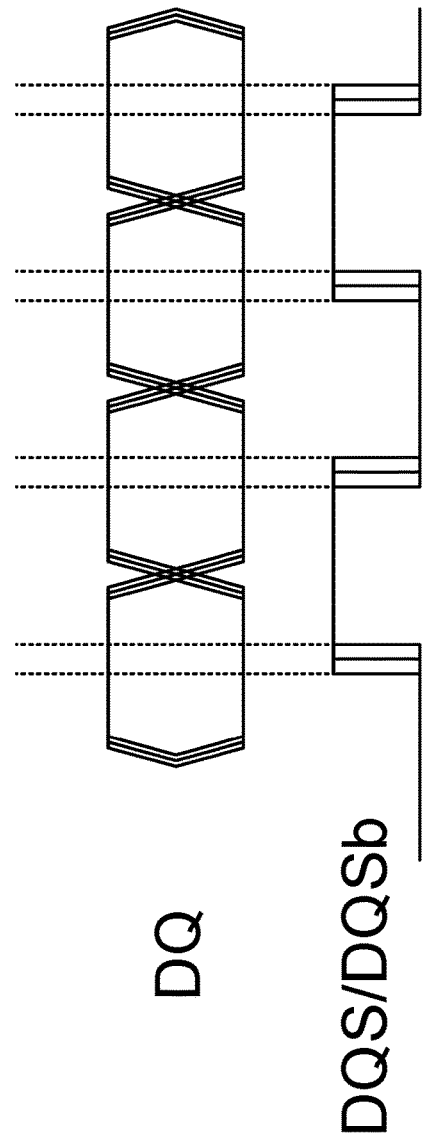

US 12,051,481 B1

AUTOMATIC TRACKING FOR CLOCK SYNCHRONIZATION BASED ON DELAY LINE ADJUSTMENT

CROSS-REFERENCE TO RELATED APPLICATION

This application claims the benefit of U.S. Provisional Patent Application No. 63/286,794, filed in the United States Patent and Trademark Office on Dec. 7, 2021, the entire disclosure of which is incorporated by reference herein.

TECHNICAL FIELD

The present disclosure relates to digital electronics, in particular automatically tracking and synchronizing data signals and clock signals.

BACKGROUND

In a source-synchronous system such as a Double Data Rate (DDR) memory sub-system or a Serializer-Deserializer (SerDes) interface, a data strobe (DQS) or a recovery clock is used to sample data (DQ) at the middle of the data eye to maintain a good timing margin for high-speed (e.g., high clock frequency) operation. This is usually achieved through an extensive training sequence at boot time (e.g., power up time) by tuning adjustable delay lines on DQS (or clock) and/or DQ (data) such that DQS (or clock) can be positioned at the center of the DQ eye.

SUMMARY

According to one embodiment of the present disclosure, a circuit includes: an early detection circuit connected to a data signal line and a clock signal line, the early detection circuit including: a first delay line configured to delay a data signal (DQ) received via the data signal line to generate a delayed data signal (DQ'); and a first phase detector configured to sample the data signal (DQ) and the delayed data signal (DQ') based on a clock signal (DQS) received from the clock signal line, the first phase detector being configured to output a first indicator signal in response to determining that an edge of the clock signal is before a desired point of a data eye of the data signal; a late detection circuit connected to the data signal line and the clock signal line, the late detection circuit including: a second delay line configured to delay the clock signal (DQS) received from the clock signal line to generate a delayed clock signal (DQS'); and a second phase detector configured to sample the data signal (DQ) based on the edge of the clock signal (DQS) and an edge of the delayed clock signal (DQS'), the second phase detector being configured to output a second indicator signal in response to determining that the edge of the clock signal (DQS) is after the desired point of the data eye of the data signal (DQ); and a delay line control logic configured to adjust one or more of a DQ adjustable delay line and a DQS adjustable delay line based on the first indicator signal and the second indicator signal to synchronize the data signal (DQ) and the clock signal (DQS).

The first phase detector may be configured to output the first indicator signal in response to determining that an early timing margin is violated in accordance with a delay setting of the first delay line of the early detection circuit, and the second phase detector may be configured to output the second indicator signal in response to determining a late timing margin is violated in accordance with a delay setting of the second delay line of the late detection circuit.

The first phase detector may include: a first sub-circuit configured to detect that a positive edge of the clock signal (DQS) is before the desired point of the data eye of the data signal (DQ); and a second sub-circuit configured to detect a negative edge of the clock signal (DQS) is before the desired point of the data eye of the data signal (DQ), and the second phase detector may include: a first sub-circuit configured to detect that the positive edge of the clock signal (DQS) is after the desired point of the data eye of the data signal (DQ); and a second sub-circuit configured to detect that the negative edge of the clock signal (DQS) is after the desired point of the data eye of the data signal (DQ).

The first sub-circuit of the first phase detector may include: a first D flip-flop and a second D-flip flop configured to detect that the positive edge of the clock signal (DQS) is before the desired point of the data eye of the data signal (DQ), the second sub-circuit of the first phase detector may include: a third D flip-flop and a fourth D-flip flop configured to detect that the negative edge of the clock signal (DQS) is before the desired point of the data eye of the data signal (DQ), the first sub-circuit of the second phase detector may include: a first D flip-flop and a second D-flip flop configured to detect that the positive edge of the clock signal (DQS) is after the desired point of the data eye of the data signal (DQ), and the second sub-circuit of the second phase detector may include: a third D flip-flop and a fourth D-flip flop configured to detect that the negative edge of the clock signal (DQS) is after the desired point of the data eye of the data signal (DQ).

The DQ adjustable delay line may be connected to the data signal line and the DQS adjustable delay line is connected to the clock signal line, and the delay line control logic may be configured to: in response to determining that the second indicator signal is asserted and the first indicator signal is not asserted, respond to the second indicator signal assertion by: determining whether a DQ delay line setting controlling the DQ adjustable delay line is at its maximum; in response to determining that the DQ delay line setting controlling the DQ adjustable delay line is not at its maximum, increasing the DQ delay line setting by one increment; in response to determining that the DQ delay line setting controlling the DQ adjustable delay line is at its maximum, determining whether a DQS delay line setting controlling the DQS adjustable delay line is at its minimum; in response to determining that the DQS delay line setting is not at its minimum, decreasing the DQS delay line setting by one increment; and in response to determining that the DQS delay line setting is at its minimum, retraining the DQ delay line setting and the DQS delay line setting; and in response to determining that the first indicator signal is asserted and the second indicator signal is not asserted, respond to the first indicator signal assertion by: determining whether a DQ delay line setting controlling the DQ adjustable delay line is at its minimum; in response to determining that the DQ delay line setting controlling the DQ adjustable delay line is not at its minimum, decreasing the DQ delay line setting by one increment; in response to determining that the DQ delay line setting controlling the DQ adjustable delay line is at its minimum, determining whether a DQS delay line setting controlling the DQS adjustable delay line is at its maximum; in response to determining that the DQS delay line setting is not at its maximum, increasing the DQS delay line setting by one increment; and in response to determining that the DQS delay line setting is at its maximum, retraining the DQ delay line setting and the DQS delay line setting.

The DQ adjustable delay line may be connected to the clock signal line and the DQS adjustable delay line is connected to the clock signal line, and the delay line control logic may be configured to: in response to determining that the second indicator signal is asserted and the first indicator signal is not asserted, respond to the second indicator signal assertion by: determining whether a DQ delay line setting controlling the DQ adjustable delay line is at its minimum; in response to determining that the DQ delay line setting controlling the DQ adjustable delay line is not at its minimum, decreasing the DQ delay line setting by one increment; in response to determining that the DQ delay line setting controlling the DQ adjustable delay line is at its minimum, determining whether a DQS delay line setting controlling the DQS adjustable delay line is at its minimum; in response to determining that the DQS delay line setting is not at its minimum, decreasing the DQS delay line setting by one increment; and in response to determining that the DQS delay line setting is at its minimum, retraining the DQ delay line setting and the DQS delay line setting; and in response to determining that the first indicator signal is asserted and the second indicator signal is not asserted, respond to the first indicator signal assertion by: determining whether a DQ delay line setting controlling the DQ adjustable delay line is at its maximum; in response to determining that the DQ delay line setting controlling the DQ adjustable delay line is not at its maximum, increasing the DQ delay line setting by one increment; in response to determining that the DQ delay line setting controlling the DQ adjustable delay line is at its maximum, determining whether a DQS delay line setting controlling the DQS adjustable delay line is at its maximum; in response to determining that the DQS delay line setting is not at its maximum, increasing the DQS delay line setting by one increment; and in response to determining that the DQS delay line setting is at its maximum, retraining the DQ delay line setting and the DQS delay line setting.

The circuit may include: a plurality of early detection circuits including the early detection circuit, each of the early detection circuits being connected to a corresponding one of a plurality of data signal lines including the data signal line; and a plurality of late detection circuits including the late detection circuit, each of the late detection circuits being connected to a corresponding one of the data signal lines, wherein the clock signal line may be shared by the data signal lines, and wherein the delay line control logic may be further configured to adjust a plurality of DQ adjustable delay lines connected to a corresponding one of the data signal lines.

The delay line control logic may be configured to: in response to detecting a plurality of first indicator signals from the plurality of early detection circuits, increase a DQS delay line setting controlling the DQS adjustable delay line; and in response to detecting a plurality of second indicator signals from the plurality of late detection circuits, decrease the DQS delay line setting controlling the DQS adjustable delay line.

According to one embodiment of the present disclosure, a method includes: receiving a data signal (DQ) and a clock signal (DQS); generating an indicator signal by: delaying the data signal (DQ) to generate a delayed data signal (DQ'); sampling the data signal (DQ) and the delayed data signal (DQ') using an edge of the clock signal (DQS) to generate a first sampled value and a second sampled value; and generating the indicator signal based on the first sampled value and the second sampled value; and adjusting one or more of a DQ adjustable delay line associated with the data signal (DQ) and a DQS adjustable delay line associated with the clock signal (DQS) based on the indicator signal to synchronize the data signal (DQ) and the clock signal (DQS).

The sampling the data signal (DQ) and the delayed data signal (DQ') using an edge of the clock signal (DQS) to generate the first sampled value and the second sampled value may include: supplying the data signal (DQ), the delayed data signal (DQ'), and the clock signal (DQS) to a phase detector including: a first phase detector including: a first D flip-flop and a second D-flip flop configured to detect that a positive edge of the clock signal (DQS) is before a desired point of a data eye of the data signal (DQ); and a third D flip-flop and a fourth D-flip flop configured to detect that a negative edge of the clock signal (DQS) is before the desired point of the data eye of the data signal (DQ), and a second phase detector including: a first D flip-flop and a second D-flip flop configured to detect that the positive edge of the clock signal (DQS) is after the desired point of the data eye of the data signal (DQ); and a third D flip-flop and a fourth D-flip flop configured to detect that the negative edge of the clock signal (DQS) is after the desired point of the data eye of the data signal (DQ).

The DQ adjustable delay line may be connected to the data signal line and the DQS adjustable delay line is connected to the clock signal line, and adjusting the DQ adjustable delay line associated with the data signal (DQ) or a DQS adjustable delay line associated with the clock signal (DQS) based on the indicator signal to synchronize the data signal (DQ) and the clock signal (DQS) may include: in response to determining that the indicator signal is asserted, respond to the indicator signal assertion by: determining whether a DQ delay line setting controlling the DQ adjustable delay line is at its minimum; in response to determining that the DQ delay line setting controlling the DQ adjustable delay line is not at its minimum, decreasing the DQ delay line setting by one increment; in response to determining that the DQ delay line setting controlling the DQ adjustable delay line is at its minimum, determining whether a DQS delay line setting controlling the DQS adjustable delay line is at its maximum; in response to determining that the DQS delay line setting is not at its maximum, increasing the DQS delay line setting by one increment; and in response to determining that the DQS delay line setting is at its maximum, retraining the DQ delay line setting and the DQS delay line setting.

The determining that the indicator signal is asserted may include detecting the indicator signal is asserted for a plurality of consecutive cycles of the clock signal (DQS).

The DQ adjustable delay line may be connected to the clock signal line and the DQS adjustable delay line is connected to the clock signal line, and adjusting the DQ adjustable delay line associated with the data signal (DQ) or a DQS adjustable delay line associated with the clock signal (DQS) based on the indicator signal to synchronize the data signal (DQ) and the clock signal (DQS) may include: in response to determining that the indicator signal is asserted, respond to the indicator signal assertion by: determining whether a DQ delay line setting controlling the DQ adjustable delay line is at its maximum; in response to determining that the DQ delay line setting controlling the DQ adjustable delay line is not at its maximum, increasing the DQ delay line setting by one increment; in response to determining that the DQ delay line setting controlling the DQ adjustable delay line is at its maximum, determining whether a DQS delay line setting controlling the DQS adjustable delay line is at its maximum; in response to determining that the DQS delay line setting is not at its maximum, increasing the DQS delay line setting by one increment; and in response to determining that the DQS delay line setting is at its maximum, retraining the DQ delay line setting and the DQS delay line setting.

The method may further include generating the indicator signal based on a mismatch between the first sampled value and the second sampled value.

According to one embodiment of the present disclosure, a non-transitory computer-readable medium having instructions stored thereon that, when executed by a processor, cause the processor to generate a digital representation of a circuit including: a late detection circuit connected to a data signal line and a clock signal line, the late detection circuit including: a delay line configured to delay a clock signal (DQS) received from the clock signal line to generate a delayed clock signal (DQS'); and a phase detector configured to sample a data signal (DQ) received from the data signal line based on an edge of the clock signal (DQS) and an edge of the delayed clock signal (DQS'), the phase detector being configured to output an indicator signal in response to determining that the edge of the clock signal (DQS) is after a desired point of a data eye of the data signal (DQ); and a delay line control logic configured to adjust one or more of a DQ adjustable delay line connected to the data signal line and a DQS adjustable delay line connected to the clock signal line based on the indicator signal to synchronize the data signal (DQ) and the clock signal (DQS).

The phase detector may be configured to output the indicator signal in response to determining a late timing margin is violated in accordance with a delay setting of the delay line of the late detection circuit.

The phase detector may include: a first D flip-flop and a second D-flip flop configured to detect that a positive edge of the clock signal (DQS) is after the desired point of the data eye of the data signal (DQ); and a third D flip-flop and a fourth D-flip flop configured to detect that a negative edge of the clock signal (DQS) is after the desired point of the data eye of the data signal (DQ).

The DQ adjustable delay line may be connected to the data signal line and the DQS adjustable delay line is connected to the clock signal line, and the delay line control logic may be configured to: in response to determining that the indicator signal is asserted, respond to the indicator signal assertion by: determining whether a DQ delay line setting controlling the DQ adjustable delay line is at its maximum; in response to determining that the DQ delay line setting controlling the DQ adjustable delay line is not at its maximum, increasing the DQ delay line setting by one increment; in response to determining that the DQ delay line setting controlling the DQ adjustable delay line is at its maximum, determining whether a DQS delay line setting controlling the DQS adjustable delay line is at its minimum; in response to determining that the DQS delay line setting is not at its minimum, decreasing the DQS delay line setting by one increment; and in response to determining that the DQS delay line setting is at its minimum, retraining the DQ delay line setting and the DQS delay line setting.

The DQ adjustable delay line may be connected to the clock signal line and the DQS adjustable delay line may be connected to the clock signal line, and the delay line control logic may be configured to: in response to determining that the indicator signal is asserted, respond to the indicator signal assertion by: determining whether a DQ delay line setting controlling the DQ adjustable delay line is at its minimum; in response to determining that the DQ delay line setting controlling the DQ adjustable delay line is not at its minimum, decreasing the DQ delay line setting by one increment; in response to determining that the DQ delay line setting controlling the DQ adjustable delay line is at its minimum, determining whether a DQS delay line setting controlling the DQS adjustable delay line is at its minimum; in response to determining that the DQS delay line setting is not at its minimum, decreasing the DQS delay line setting by one increment; and in response to determining that the DQS delay line setting is at its minimum, retraining the DQ delay line setting and the DQS delay line setting.

The digital representation of the circuit may be included in a digital representation of an input/output circuit.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 2A is a timing diagram showing clock (DQS) positioned in the middle of the data (DQ) eye after performing an initial adjustment or training.

FIG. 2B is a timing diagram showing that, in the absence of adjustment, clock (DQS) and data (DQ) delays may vary due to voltage and temperature variation.

DETAILED DESCRIPTION

Aspects of the present disclosure relate to automatic tracking for clock synchronization based on delay line adjustment. In more detail, aspects of embodiments relate to a continuous real-time early-late detection circuit that controls a delay line structure so that the delay line can be adjusted dynamically and glitchlessly without stopping input/output traffic. This detection circuit makes use of the live traffic and adjusts the delay line to react to any changes in timing due to changes in, for example, voltage, temperature, or frequency adjustment and variation.

In high-speed semiconductor design, performance, power, and area are some metrics used to differentiate one product from another. However, the difficulty of designing a working integrated circuit increases as technology nodes shrink and the robustness of an integrated circuit design is facing more considerable challenges from process variation, voltage variation, and temperature variation. For a high-speed input/output (I/O) circuit such as a circuit for double data rate (DDR) memory and for serializer-deserializer (SerDes) for data communication (which may also operate at double data rate), both edges of the clock or data strobe (DQS) (e.g., both the rising edge and the falling edge) are being used to sample data (DQ) to fully utilize the bandwidth of every transaction and to maximize the performance (e.g., data bandwidth). As clock rates increase, e.g., to gigahertz (GHz) operating speeds, the timing margin decreases. The variation mentioned earlier can further shrink the timing margin to be virtually non-existent, thereby leading to transaction errors (e.g., incorrect reads and/or writes).

Figure 1:
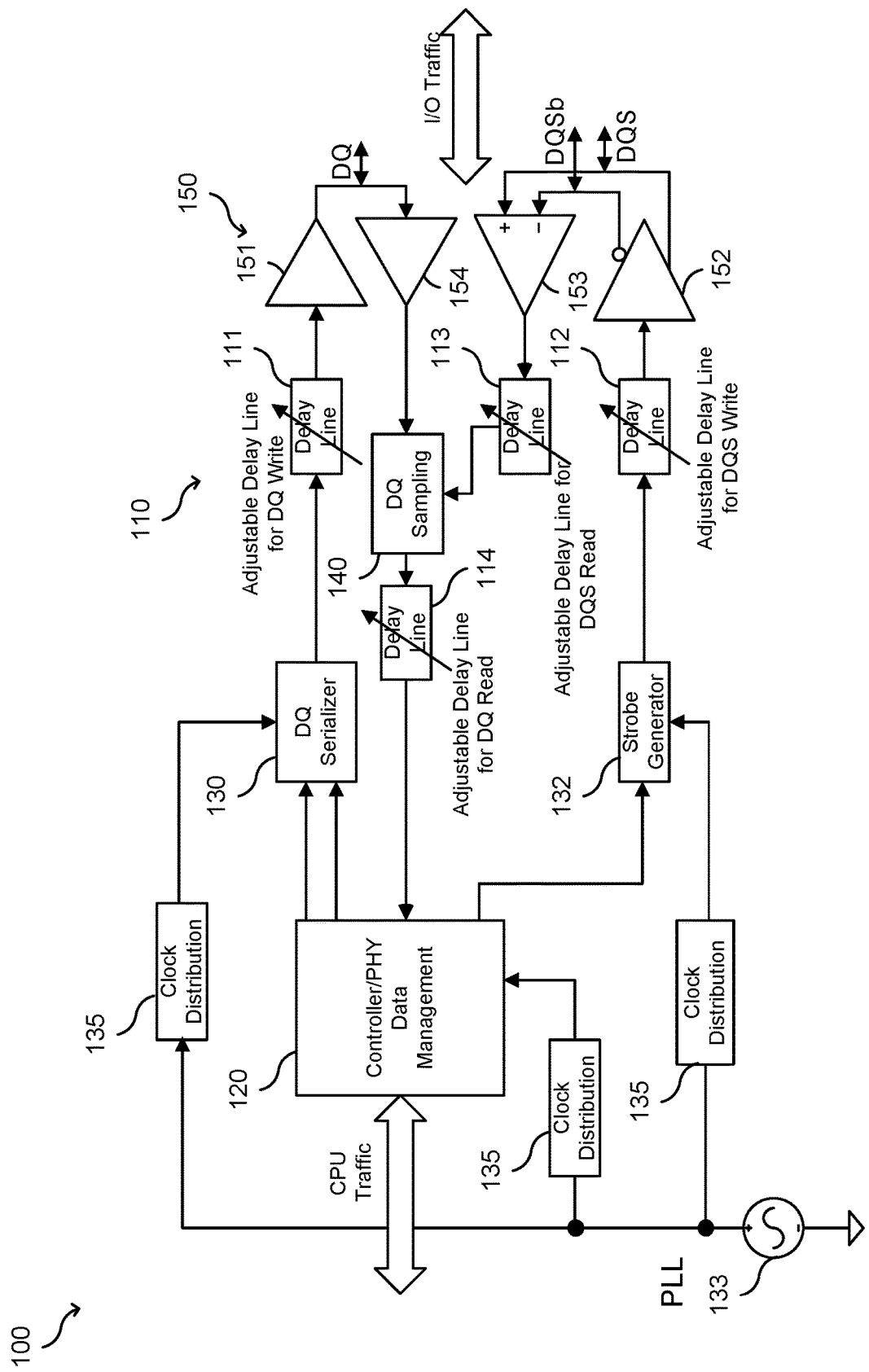
FIG. 1 illustrates a block diagram of an input/output system including adjustable delay lines to synchronize clock (DQS) and data (DQ) signals.

A training procedure is performed on a delay line design to maximize the timing margin between DQS and DQ to address this issue. FIG. 1 illustrates a block diagram of an input/output circuit 100 including adjustable delay lines 110 (including adjustable delay lines 111-114) to synchronize clock (DQS) and data (DQ) signals. In the example input/output circuit 100 shown in FIG. 1, input/output (I/O) traffic is transmitted and received (e.g., interacting with a memory or a serial communication line). For the sake of discussion, the example shown in FIG. 1 may operate in a half-duplex manner, where the input/output circuit 100 may operate in a receive mode or a transmit mode. When operating in a transmit mode, data received from a central processing unit (CPU) may be received at a controller/physical layer (PHY) data management controller 120. The data to be transmitted may be provided to a DQ serializer 130, which serializes the data and provides the serialized data to an adjustable delay line for data writes (a DQ write adjustable delay line 111). The controller 120 also controls a strobe generator 132, which takes in an internal clock signal 133 from a clock distribution network 135 and which outputs a clock signal or strobe signal DQS. This strobe signal may similarly be delayed by an adjustable delay line for the strobe write (a DQS write adjustable delay line 112), where the adjustable delay lines for the DQ write and the DQS write are adjusted such that the data signal DQ and the strobe signal DQS are synchronized. The delayed data DQ and the delayed clock signal DQS are then supplied as part of the I/O traffic (after being appropriately amplified by a corresponding amplifier 150).

When operating in a receive mode, a data signal DQ and a clock or strobe signal DQS are received as part of the I/O traffic (e.g., from a memory device or a communications link). The received data signal DQ and received strobe signal DQS may be amplified by corresponding ones of the amplifiers 150 (including input/output amplifiers 151 and 154 for DQ and input/output amplifiers 152 and 153 for DQS) and the received data signal DQ is sampled by a DQ sampling circuit 140 using the received strobe signal DQS. Before the received strobe signal DQS is supplied to the DQ sampling circuit 140, it may first be delayed by an adjustable delay line for DQS read 113. The sampled DQ signal may then be supplied to an adjustable delay line for DQ read 114, and the resulting delayed data signal is supplied to the controller 120, which can supply the data to the CPU (e.g., over an internal bus).

By adjusting the adjustable delay lines 110 for the DQS and DQ paths, DQS can be positioned at or near the middle of the DQ eye to maximize the timing margin, as shown in FIG. 2A (as shown by the dashed vertical lines extending from the rising and falling transitions of the DQS signal, or its complement DQSb, that are aligned with the middles of the DQ eyes). This is usually done as part of an initialization sequence of the circuit (e.g., during boot up or power up).

However, after the initial training, the operating temperature and voltage may vary over time, which causes the timing to be different from the timing during the initial training, when the operating conditions of the delay lines were different. As a result, the previous settings for the delay lines obtained during the initialization may no longer be valid because, for example, the insertion delay per tap in the delay line is susceptible to voltage and temperature variation. FIG. 2B is a timing diagram showing that, in the absence of adjustment, clock (DQS) and data (DQ) delays may vary due to voltage and temperature variation. In the example shown in FIG. 2B, the DQS vs. DQ delay lines settings are kept at the same settings determined during initialization, but the transitions of the DQS are not at the centers of the DQ eyes due to voltage and temperature variation, where this variation is illustrated by the multiple transitions spread over time and where the critical timings of the DQS transitions (e.g., minimum delay and maximum delay) are indicated by dashed lines.

In some systems, periodic recalibrations are performed by stopping input/output data traffic or using times when the I/O circuit is idle (if this can be known beforehand) to perform a recalibration to restore the timing margin (e.g., so that the transitions of the clock or DQS signal are aligned with the middles of the DQ eyes).

Figure 3:
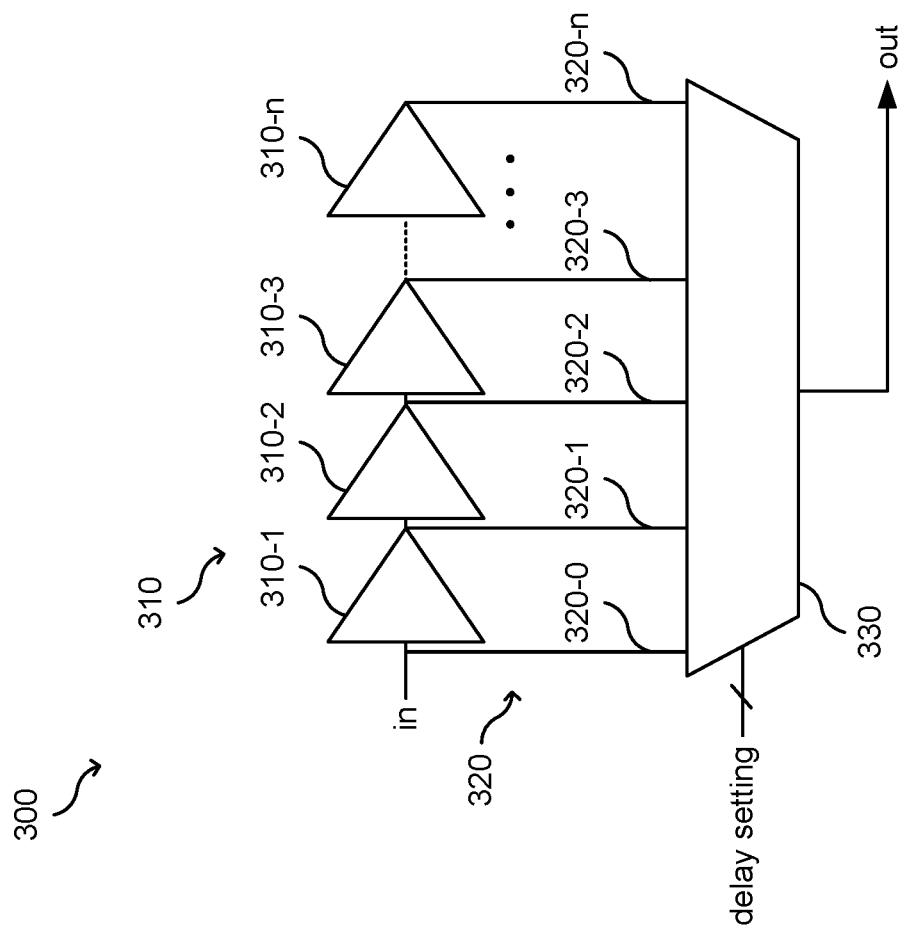
FIG. 3 is a simplified structure depicting a model of an adjustable delay line.

FIG. 3 is a simplified structure depicting a model of an adjustable delay line 300. A delay line is constructed by a chain of delay elements 310 cascaded together, with various delay line taps 320 located between the delay elements 310 (e.g., assuming a chain of n delay elements, FIG. 3 illustrates a zeroth delay line tap 320-0 at the input of a first delay element 310-1, a first delay tap 320-1 at the output of the first delay element 310-1, a second delay tap 320-2 at the output of a second delay element 310-2, a third delay tap 320-3 at the output of a third delay element 310-3, and so on, ending with an n-th delay tap 320-n at the output of n-th delay element 310-n). In the example shown in FIG. 3, each delay element may be implemented as a non-inverting digital buffer or voltage buffer. An input to the delay line is supplied at the input to the first delay element (e.g., 310-1) in the chain of delay elements 310. The number of delay elements engaged in the delay line can be selected based on a delay setting. In the example of FIG. 3, the delay setting is an input to a multiplexer 330 (or MUX), where the delay setting is used to select one particular tap of the chain of delay elements 310, where that tap is supplied as the output (out) of the adjustable delay line 300. FIG. 3 merely provides one example of an implementation of an adjustable delay element, but embodiments of the present disclosure are not limited thereto and may be applied to other implementations of an adjustable delay line, such as by using an inverter-based delay element or a voltage-controlled delay element. In other words, embodiments of the present disclosure are not limited to particular structures for implementing adjustable delay lines.

The overall insertion delay from the input (in) of the adjustable delay line 300 to its output (out) can be quantified by this equation:

$$Ttotal = Tintr + x * Ttap \quad (1)$$

where: Ttotal is total insertion delay of the delay line from in to out;
 Tintr is the intrinsic delay of the delay line with zero delay elements (e.g., selecting
 the zeroth delay line tap 320-0, with the delay through MUX 330)
 Ttap is the per tap delay (the delay time per delay element); and
 x is the number of delay elements engaged.

In some implementations of adjustable delay lines 300, the delay elements 310 and the MUX 330 are made up of metal oxide semiconductor field effect transistors (MOSFETs), which are susceptible to process, voltage, and temperature (PVT) variation over time. Each delay element 310 modeled in Equation (1) can carry one absolute delay ($Ttap_0$) at an initial time (e.g., at time 0, when the circuit is first powered on or booted), under a given voltage and temperature condition, while it may carry a different delay amount ($Ttap_t$) at a later time, say time t, when voltage and temperature conditions are altered by the environment. This can be explained from the equations below:

$$Ttotal_0 = Tintr_0 + x*Ttap_0 \quad (2)$$

$$Ttotal_t = Tintr_t + x*Ttap_t \quad (3)$$

where the subscript of each delay component represents the measurement time 0 or time t.

Due to voltage and temperature variation, a circuit may exhibit behavior where the intrinsic delay at an initial time ($Tintr_0$) is different than the intrinsic delay at a later time t ($Tintr_t$). Likewise, the per tap delay at an initial time ($Ttap_0$) is different than the per tap delay at a later time t ($Ttap_t$):

$$Tintr_0 \neq Tintr_t$$

$$Ttap_0 \neq Ttap_t$$

Therefore, the total amount of delay introduced by an adjustable delay line at a given setting will vary over time due to voltage and temperature variation ($Ttotal_0 \neq Ttotal_t$).

As shown in equations (2) and (3), although the number of delay elements x used is still the same, the total insertion delay measured at different times (time 0 and time t) may be different. In this case, a recalibration at time t may be performed to adjust the total insertion delay to re-align the DQS or clock with the middle of the eyes of the DQ signal.

$$Ttotal_0 = Tintr_0 + x*Ttap_0 \quad (4)$$

$$Ttotal_t = Tintr_t + y*Ttap_t \quad (5)$$

$$Tintr_0 \neq Tintr_t$$

$$Ttap_0 \neq Ttap_t$$

$$x \neq y$$

$$Ttotal_0 = Ttotal_t$$

By adjusting the number of delay elements engaged, although each delay element can still have a different delay Ttap at different times (time 0 and time t), the total delay at time t ($Ttotal_t$) can be brought back to equal the total delay at time 0 ($Ttotal_0$), as shown in Equations (4) and (5), by engaging y delay elements in Equation (5) instead of x delay elements in Equation (4). (Noting that there is some quantization in the adjustability of the delay line, in units of Ttap, because only a discrete number of delay elements can be engaged. As such, the total delay time may not be exactly equal, but Ttap is sufficiently small to align the clock or DQS signal with approximately the middle of the eyes of the data signal DQ.)

The delay line calibration can make use of a delay lock loop (DLL) design with the same delay element used in the delay lines for DQS and DQ to calibrate against a target clock cycle, for example. The assumption here is that the target clock cycle is still the same between time 0 and time t, which is always true.

In addition to the periodic recalibration to compensate for voltage and temperature variation over time, dynamic voltage and frequency scaling (DVFS) also creates circumstances that may require a recalibration. In more detail, during operation, a system using DVFS can scale the voltage and frequency up or down depending on the traffic demand. In turn, the power and performance can be scaled accordingly. DVFS has been widely used in mobile systems, such as cell phones and laptops, where performance and battery life (e.g., energy usage) are balanced against one another or traded off based on user demands. A small reduction in voltage can lead to a significant amount of energy savings due to the quadratic relationship between energy consumption and voltage as shown in Eqn. (6).

$$E=CV^2f \qquad (6)$$

where: C is the total capacitance;
V is the supply voltage;
f is the operating frequency; and
E is the consumed energy.

The reduction of operating voltage and frequency can lead to tremendous power savings when the system computing resources are not in high demand (e.g., in low demand) or when the system computing resources are in an idle state.

Unlike the voltage and temperature variations due to changes in the environment, in DVFS, voltage and frequency are changed intentionally which requires further adjustment on the delay lines to maintain a good timing margin (e.g., to keep the clock edges near the middle of the eye such that there is a good margin, in the time dimension, between the clock edges and the transitions of the data signal DQ, e.g., an early timing margin to protect against clock signals that arrive early in the data eye, such as before a desired point in the data eye, and a late timing margin to protect against clock signals that arrive late in the data eye, such as after a desired point in the data eye). The values of voltage versus frequency profiles in DVFS may be predetermined. During initialization, a training sequence is performed on a per-profile basis to establish associated sets of delay line settings (and other timing parameters) for each voltage versus frequency profile. Once the per-profile settings and parameters are established, when the system switches to a given voltage and frequency profile during normal operation, the system applies the settings and parameters corresponding to that given voltage and frequency profile. In comparative systems, this application of per-profile settings and parameters is performed by stopping the input/output traffic through the input/output circuit and going through a voltage and frequency change procedure, which adjusts the delay lines and other timing parameters accordingly, while there is no input/output traffic through the input/output circuit.

Table 1 shows an example of voltage vs. frequency profiles used in a low power double data rate (LPDDR) memory sub-system widely used in cell phone and laptop applications. In Table 1, the relationship of each voltage point is: $v_1<v_2<\ldots<v_{14}$ where each voltage point may be 10-15 mV apart or less to avoid dramatic changes in the voltage step, because large voltage changes may lead to a system failure, and where Table 1 shows the data rate (in megabits per second or Mbps) associated with the corresponding profile.

TABLE 1

| DVFS Profile | Data Rate (Mbps) | Nominal VDD (mV) |
|---|---|---|
| 1 | 533 | $v_1$ |
| 2 | 1067 | $v_2$ |
| 3 | 1600 | $v_3$ |
| 4 | 2133 | $v_4$ |
| 5 | 2750 | $v_5$ |
| 6 | 3200 | $v_6$ |
| 7 | 3733 | $v_7$ |
| 8 | 4267 | $v_8$ |
| 9 | 4800 | $v_9$ |
| 10 | 5500 | $v_{10}$ |
| 11 | 6000 | $v_{11}$ |
| 12 | 6400 | $v_{12}$ |
| 13 | 7500 | $v_{13}$ |
| 14 | 8533 | $v_{14}$ |

Figure 4A:
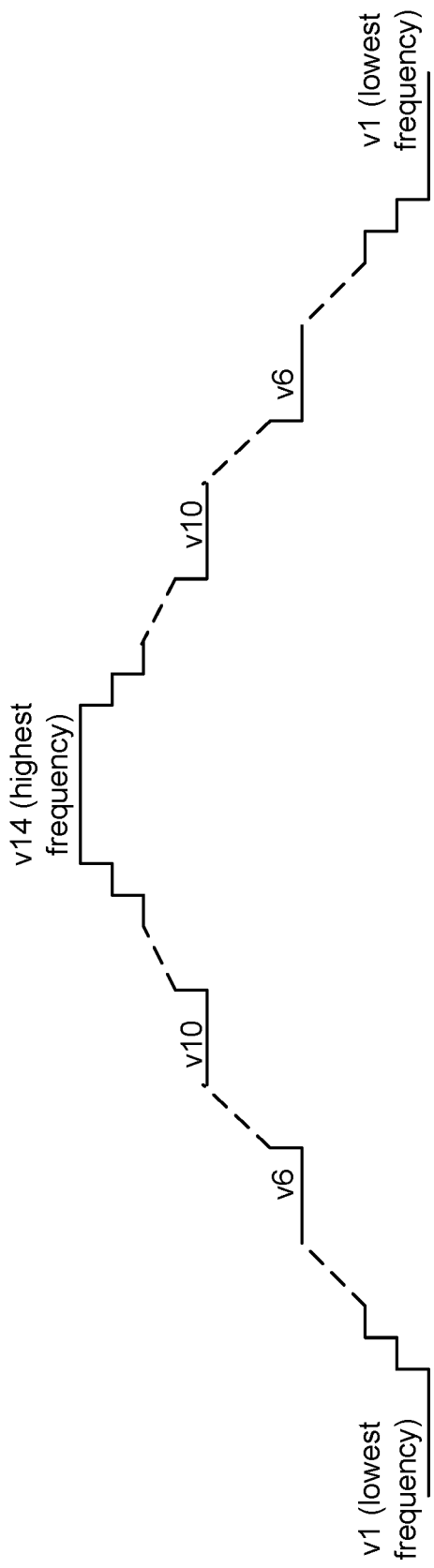
FIG. 4A is a graph depicting frequency changes as a function of voltage in the process of scaling up and scaling down the operating frequency in an integrated circuit using a dynamic voltage and frequency scaling (DVFS).

FIG. 4A is a graph depicting frequency changes as a function of voltage in the process of scaling up and scaling down the operating frequency in an integrated circuit using a dynamic voltage and frequency scaling (DVFS).

During regular operation, when the traffic demand is the lowest, profile 1, corresponding to the lowest voltage and lowest frequency, can be used. In this case, the delay line settings and other timing parameters trained under the conditions corresponding to profile 1 are applied. When there is a demand for the highest performance on the system, then the system may apply the corresponding highest performance profile, e.g., profile 14 by applying, for example, a DVFS stepping procedure as shown in FIG. 4A. That is, the regular traffic is broken into a number of segments corresponding to the different profiles (e.g., 14 segments). Each segment is operated under a corresponding DVFS profile for a period of time (e.g., a certain period of time, which may be specified by the DVFS profile or other settings), advancing from one profile to the next profile in the sequence until eventually reaching the highest profile (e.g., profile 14) and staying there for the remaining (high) traffic demand. During each DVFS profile change (e.g., between the different segments), the input/output traffic is stopped, and the delay line settings and timing parameters associated with the following profile are applied before the traffic resumes at the next voltage and frequency point of the next profile in the sequence.

Gradual and fine voltage and frequency stepping is usually required to avoid a sudden change in the energy demand so that the power supply and capacitance can keep up and avoid any instability in the power delivery system. When there is no input/output traffic demand on the system (or reduced input/output traffic demand), a reverse, stepping down procedure is used to gradually park the system at the lowest voltage and frequency point (or reduce the voltage and frequency to a lower level sufficient to meet the input/output traffic) to reduce power consumption. In some circumstances, the system is further put into a sleep mode by shutting down the power supply to the majority of the devices in the system.

In such a design, to maintain a decent timing margin across voltage and temperature variation and/or to support DVFS, initial trainings at one or more voltage and frequency points are required and periodic recalibration is also needed. During the initial training, recalibrations, switches between different profiles, input/output traffic must be stopped, which can reduce the overall throughput of the system and/or cause interruptions in service.

Figure 4B:
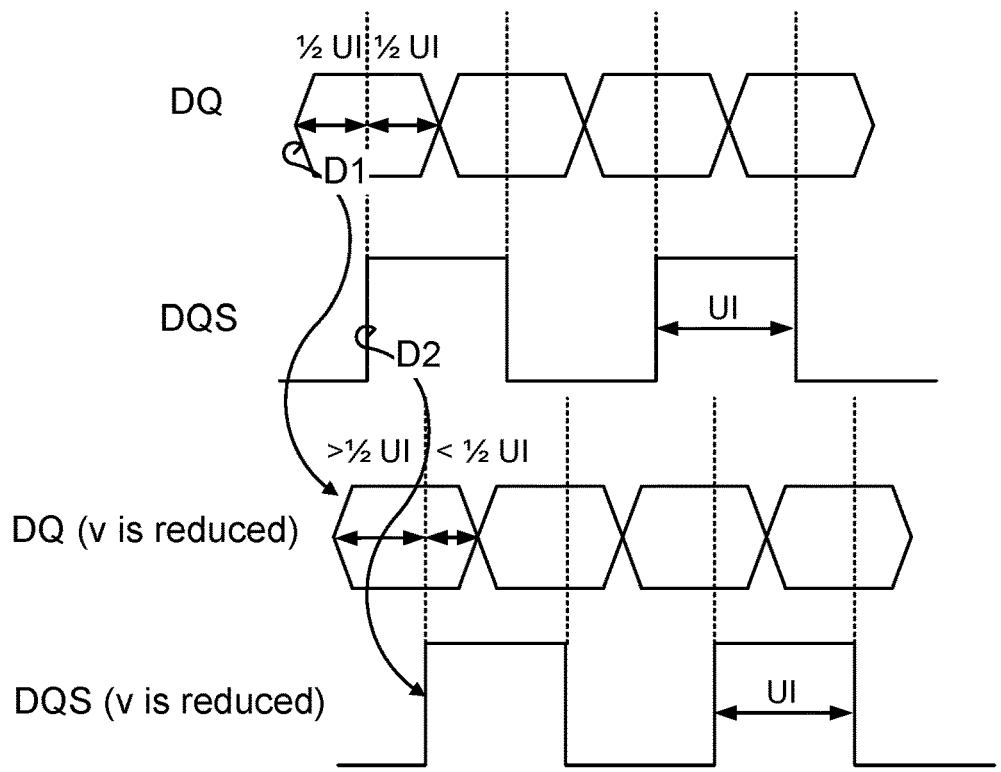
FIG. 4B and FIG. 4C include timing diagrams depicting changes in clock (DQS) and data (DQ) synchronization due to changes in frequency in a DVFS system.
Figure 4C:
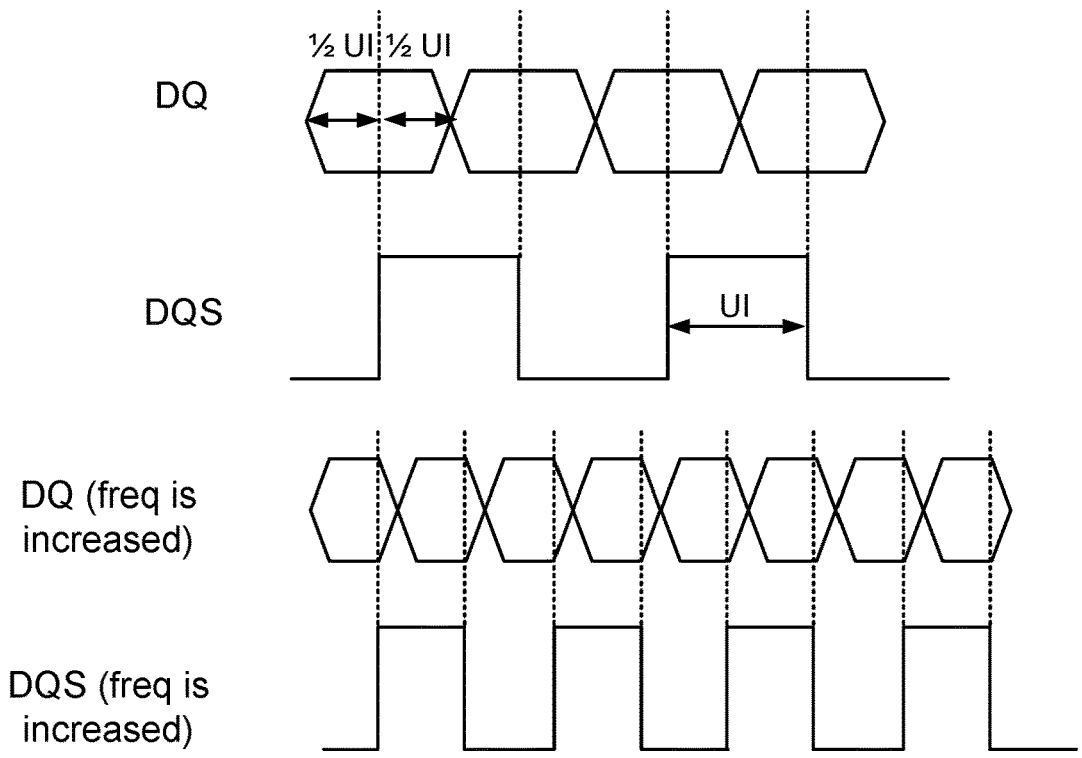

FIG. 4B and FIG. 4C include timing diagrams depicting changes in clock (DQS) and data (DQ) synchronization due to changes in frequency in a DVFS system. In more detail, FIG. 4B shows a case where data (DQ) and clock (DQS) are synchronized such that the rising and falling edges of the clock DQS are aligned with the centers of the data eyes (e.g., with ½ unit interval (UI) spacing on either side of the rising or falling edge). However, when the voltage (v) is reduced, the data and the clock may both experience a change in timing such that the rising and falling edges of the clock DQS are no longer aligned with the center of the data eye (e.g., the portion of the data eye before the rising edge of clock DQS may be >½ UI, and the portion of the data eye after the rising edge of clock DQS may be <½ UI, and the subsequent data eye at the falling edge of clock DQS may be affected similarly). Likewise, FIG. 4C shows a case where the frequency is increased, in which case the rising and falling edges of the clock DQS may also no longer fall at or near the center of the data eye (e.g., in the example of FIG. 4C, the rising and falling edges of the clock DQS are near the trailing edges of the data eyes, rather than near the middles of the data eyes).

Embodiments of the present disclosure relate to systems configured to maintain a good (e.g., large) timing margin between clock (DQS) and data (DQ) without stopping traffic for retraining during operation. In addition, embodiments of the present disclosure enable adjusting the delay settings without stopping traffic when switching between voltage/frequency profiles in a circuit using DVFS. As such, embodiments of the present disclosure provide increased performance (e.g., because no time is lost to stopping or pausing of traffic and because it reduces the time lost to retraining to account for voltage and temperature variation).

Some aspects of embodiments relate to a continuous real-time early-late detection circuit and controller configured to calibrate the delay lines of a clock signal (DQS) and a data signal (DQ). The detection circuit uses live traffic (e.g., live clock DQS and data DQ traffic) to adjust the delay lines accordingly so that the detection circuit can track and maintain the relative offset between the clock (DQS) and data (DQ) by controlling the adjustable delay lines. In some embodiments, this closed-loop system updates the delay lines one step at a time to achieve a relatively glitchless transition without interrupting the traffic. Because the detection circuit reacts to the real-time traffic (as opposed to recalibration or training traffic), embodiments of the present disclosure can keep track of, and adapt to, timing changes over time due to, for example, voltage and temperature variation. In addition, embodiments of the present disclosure can perform these adjustments to the delay lines without stopping traffic (e.g., while still processing input/output traffic).

Embodiments of the present disclosure also provide a usage model of DVFS where the voltage can also be altered dynamically while keeping the frequency at a given set point. This provides the input/output communication system with more flexibility to scale power consumption without stopping the traffic. In some systems, when a frequency of operation is changed (e.g., when the clock frequency is changed), the system may also need to update other timing parameters, which are frequency dependent per-protocol requirements. These systems perform this update by stopping traffic to perform a switch-over. However, embodiments of the present disclosure perform updates to timing parameters (e.g., delay lines) in a manner that allows the voltage to be changed without a frequency change, thereby allowing systems that include embodiments of the present disclosure to scale the voltage up and down dynamically without stopping traffic, thereby allowing the power and performance to be further fine-tuned accordingly.

In addition, circuits according to some embodiments of the present disclosure also react to changes in frequency by dynamically adjusting the DQS vs. DQ offset (e.g., setting the adjustable delay lines) accordingly, without stopping the input/output traffic. Nevertheless, there are some circumstances that may still require a stop in traffic for a frequency change, such as retraining a phase-locked loop (PLL) or adjusting protocol-related timing parameters, and in these circumstances, embodiments of the present disclosure may still be used to handle other timing changes that do not require a stop in traffic (e.g., the aforementioned adjustments to compensate for voltage and temperature variation and to compensate for changes due to a change in voltage and frequency profile in circuits that use DVFS).

Figure 5A:
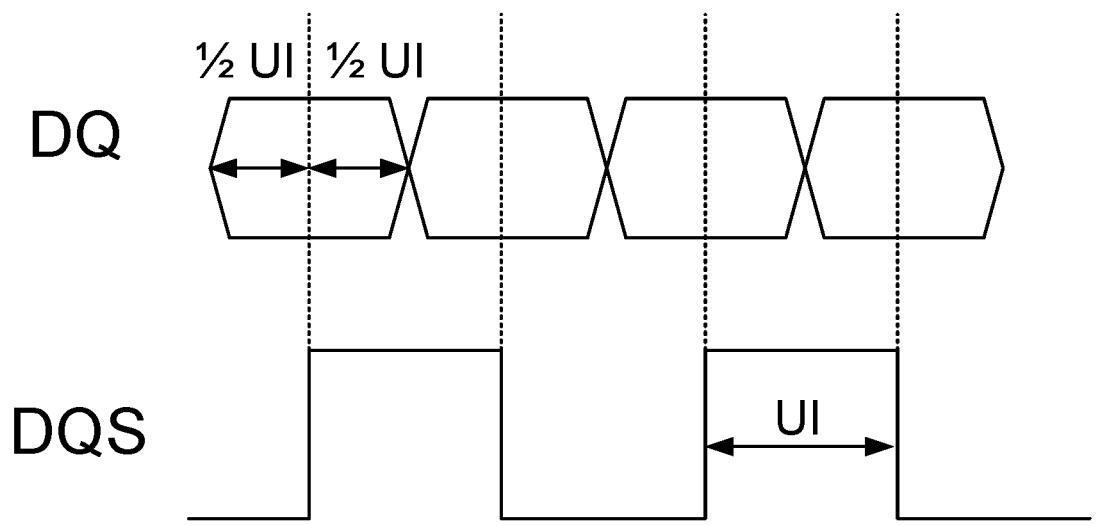
FIG. 5A is a timing diagram showing the target or ideal synchronization case in which the clock (DQS) samples the data (DQ) at the middle of the data eye.

Aspects of embodiments of the present disclosure relate to an early-late detection circuit to initiate a continuous background calibration based on active traffic and a control algorithm that controls the timing of signals to provide setup and hold margins between clock signal DQS and data signal DQ. In more detail, embodiments of the present disclosure control the timing (e.g., phase shift) of the clock DQS such that it not only samples DQ signals at or near the middle of the DQ eye (i.e., at or near the ½ UI point), shown in FIG. 5A, but also tests the borderline margin in which a data signal DQ may fail to be sampled correctly. Embodiments of the present disclosure provide a continuous early-late detection circuit that is configured to be: (1) fast enough to detect the drift and re-center DQS to substantially the middle of DQ (e.g., the data eyes of the data signal DQ, such that the timing margin both before and after the clock transition DQS are equal and both approximately ½ UI); (2) provide a delay mismatch correction that does not corrupt the real-time data DQS signals and that is glitchless; and (3) uses a calibration circuit that has small area and power such that it can be duplicated for every DQ bit.

Figure 5B:
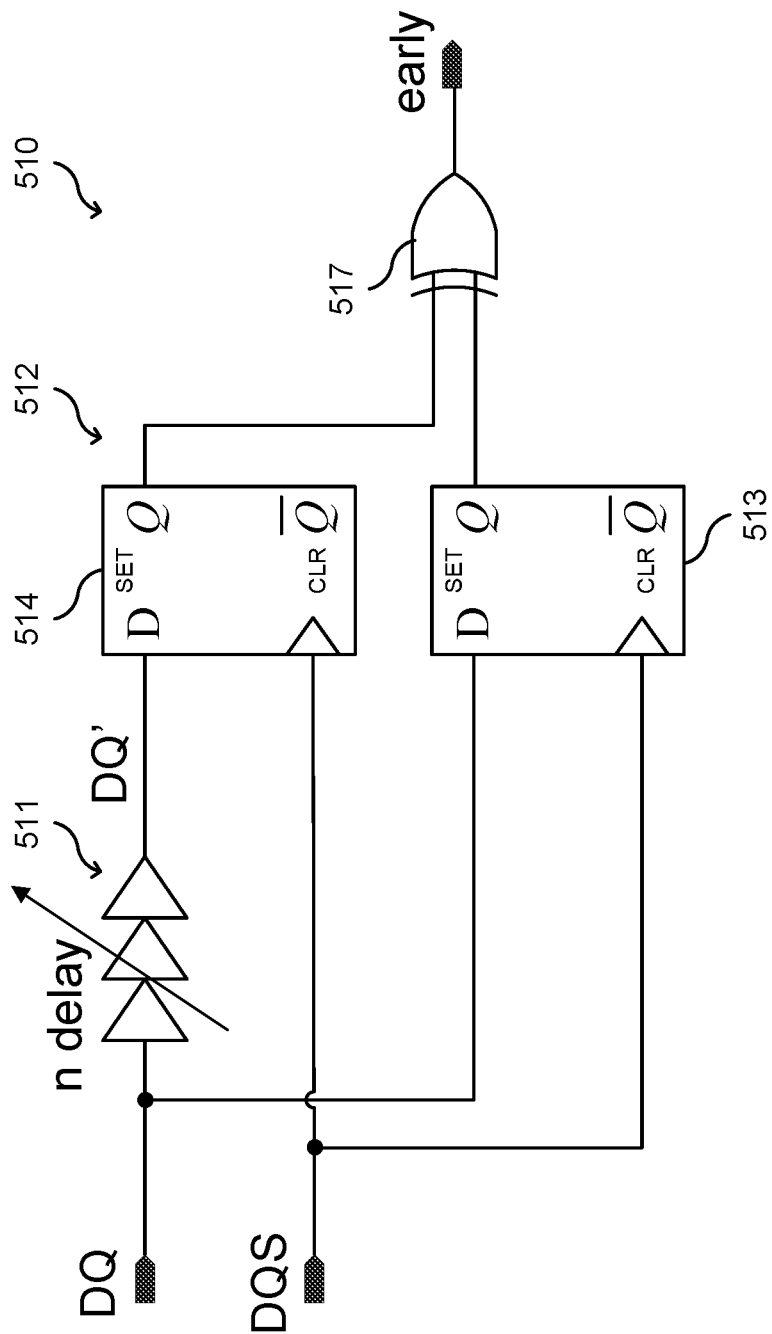
FIG. 5B illustrates the basic concept of an early detection circuit according to one embodiment of the present disclosure where the DQS rising edge samples both DQ and its delayed version DQ'.
Figure 5C:
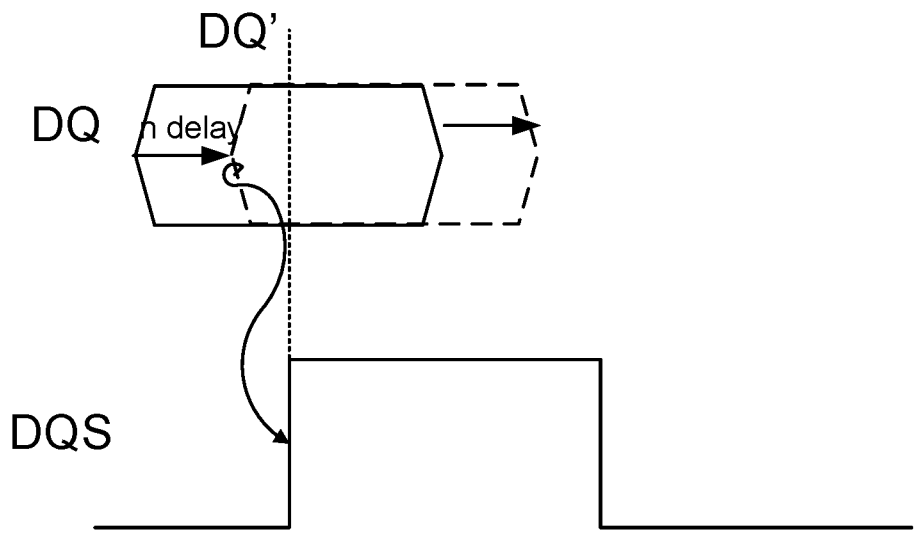
FIG. 5C is a timing diagram depicting a case where the early detection circuit detects that the timing margin has not been violated according to one example of the present disclosure.
Figure 5D:
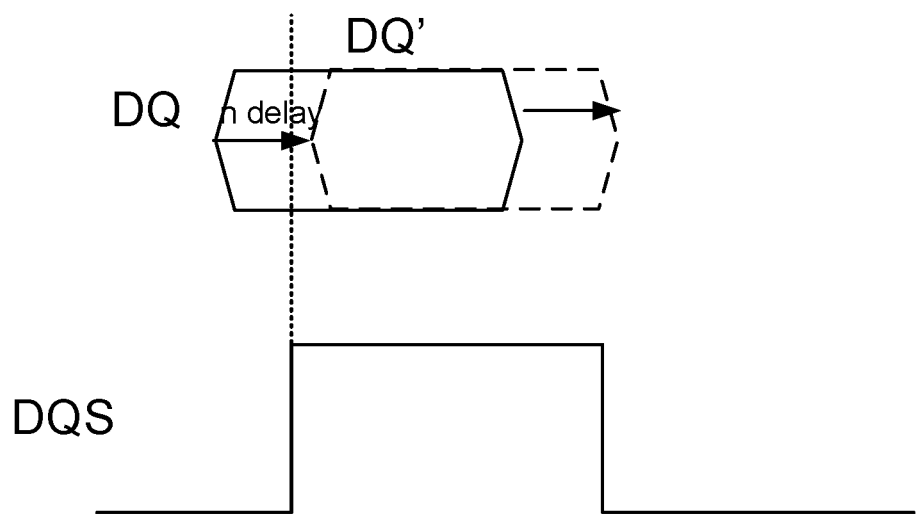
FIG. 5D is a timing diagram depicting a case where the early detection circuit detects that the timing margin has been violated according to one example of the present disclosure.
Figure 5E:
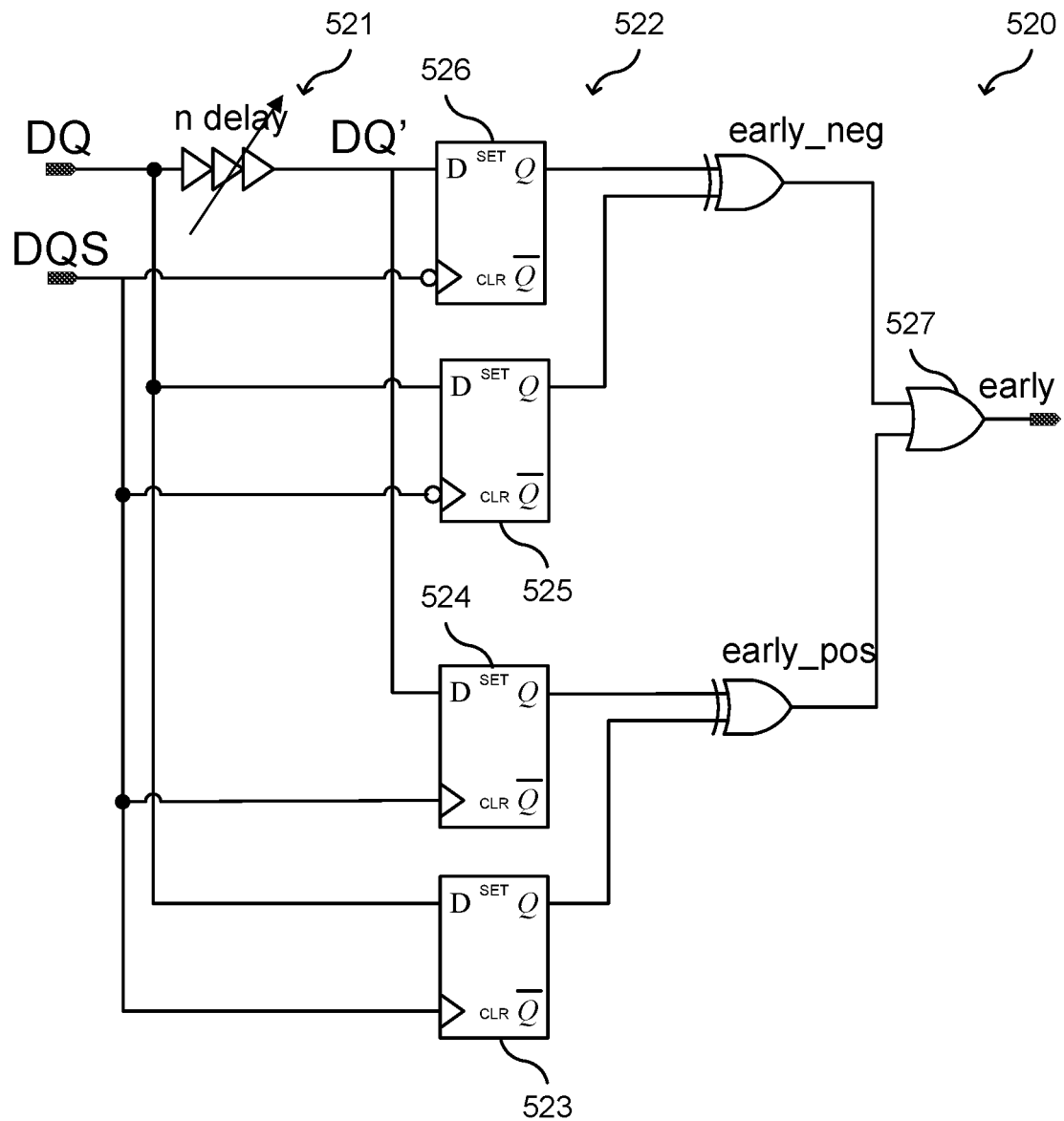
FIG. 5E shows an early detection circuit between DQS vs. DQ according to one embodiment of the present disclosure.
Figure 5F:
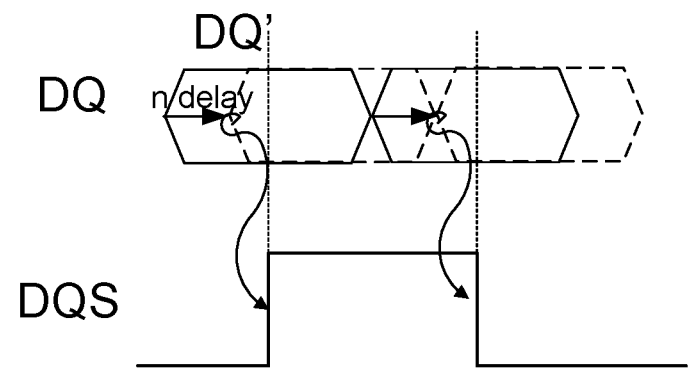
FIG. 5F is a timing diagram depicting a case where the early detection circuit detects that the timing margin has not been violated according to one example of the present disclosure.
Figure 5G:
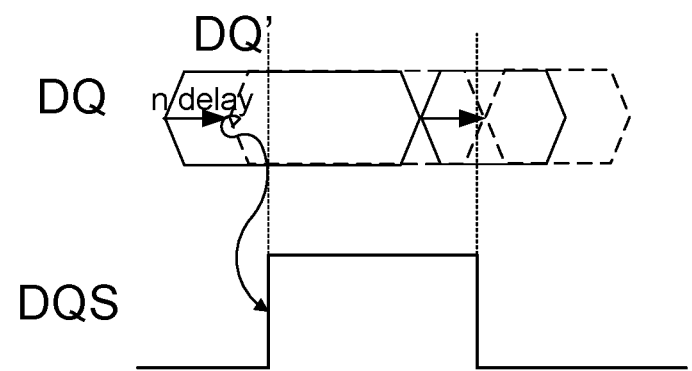
FIG. 5G is a timing diagram depicting a case where the early detection circuit detects that the early timing margin has been violated according to one example of the present disclosure.
Figure 5H:
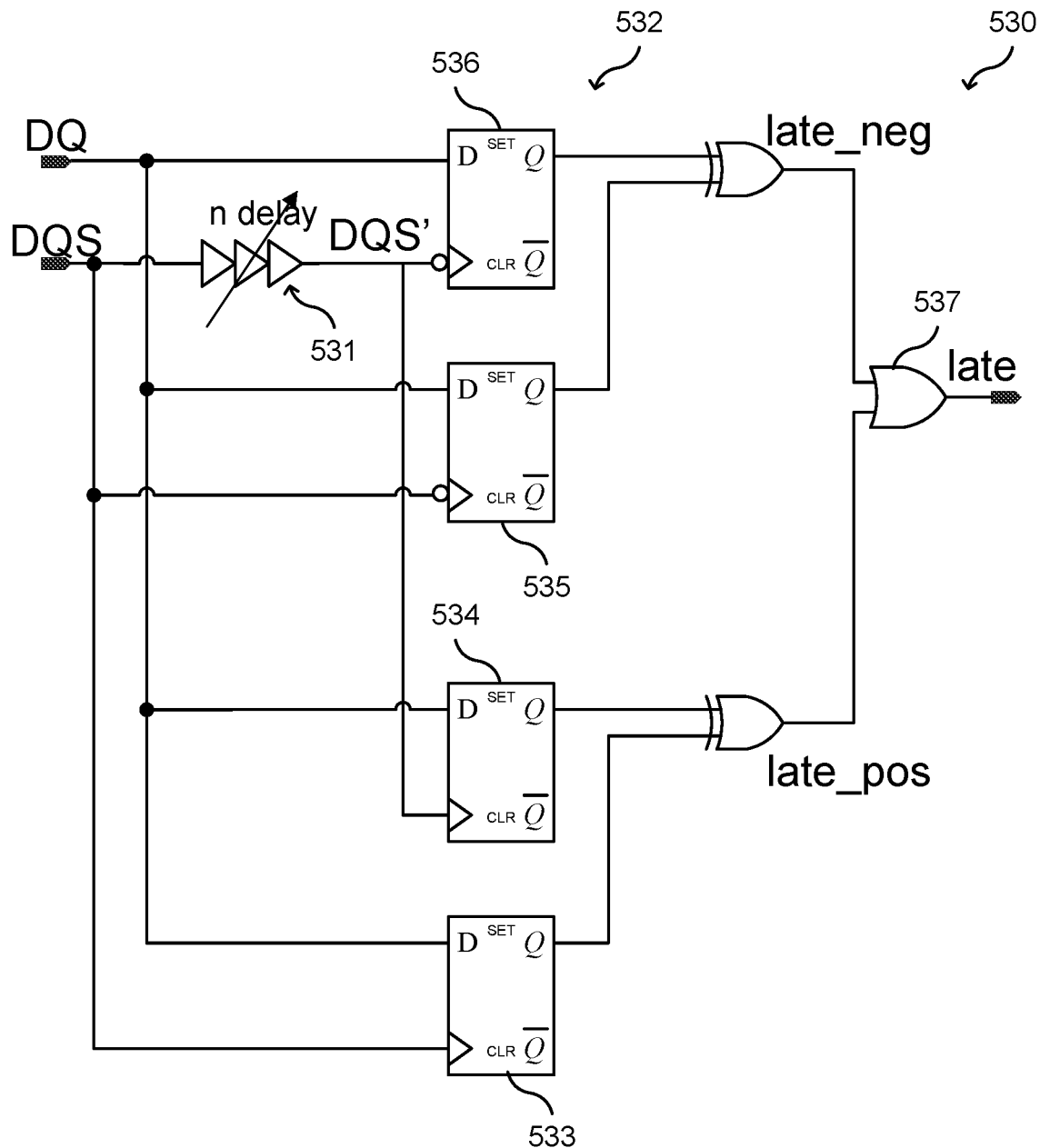
FIG. 5H shows a late detection circuit between DQS vs. DQ according to one embodiment of the present disclosure.

The detailed implementation of an early-late detection circuits according to some embodiments of the present disclosure are shown in FIGS. 5B, 5E, and 5H.

FIG. 5B illustrates the basic concept of an early detection circuit 510 according to one embodiment of the present disclosure where the rising edge of DQS samples both DQ (shown in FIG. 5C and FIG. 5D in solid lines) and a delayed version DQ' (shown in FIG. 5C and FIG. 5D with dashed lines). To ensure that the rising edge of the clock signal or DQS signal has enough setup time against data signal DQ, the DQS rising edge samples both data signal DQ and delayed data signal DQ', where DQ' is the delayed version of DQ, shown in FIG. 5B as being produced by supplying the data signal DQ to an adjustable delay line 511. In this example, the delay introduced by the adjustable delay line 511 is quantified as "n delay," and may be a value less than ½ UI. (In some embodiments, n is an integer referring to the number of delay elements, such as inverters, that are engaged in a delay line or adjustable delay line to delay the signal. For example, as described in FIG. 3 above, n refers to the delay setting provided as input to the MUX to select a particular delay line tap 320 from the chain of delay elements 310. However, embodiments of the present disclosure are not limited thereto and the term "n delay" may be used generally to refer to an amount of delay introduced by the delay line.) This value of n may be adjusted depending on the margin required, where larger values of n result in the detection of smaller variations in timing. The original data signal DQ and the delayed data signal DQ' are supplied to a phase detector 512, along with the clock signal DQS, where, in the embodiment shown in FIG. 5B, the phase detector 512 includes two D flip-flops connected such that the clock signal DQS controls a first D flip flop 513 to sample the value of the data signal DQ and also controls a second D flip flop 514 to sample the delayed data signal DQ' (e.g., at the rising edge of the clock signal DQS). If both D flip-flops (FFs) 513 and 514 have the same outputs (e.g., as determined by an XOR gate 517), the early signal output (or early indicator) will be 0, indicating that any early drift is still within the timing margin set by the adjustable delay line 511, such as that shown in the timing diagram of FIG. 5C. However, if different data bits are sampled by the clock signal DQS from the data signal DQ and the delayed data signal DQ', then the early output or early indicator is 1, meaning that the timing margin of the setup time has been violated (e.g., because different data bits were sampled, as shown in the example timing diagram of FIG. 5D, where the data signal DQ is being sampled from within an early part of the data eye, but outside of the delayed data signal DQ'), and the delay line settings of DQS or DQ need to be updated. Note that violation of the timing margin of the setup time merely provides a warning that the clock signal DQS and the data signal DQ are falling out of synchronization and that the data sampler is still able to sample the correct values from the data signal DQ based on the clock signal DQS. The early detection circuit 510 shown in FIG. 5B samples the data signal DQ and the delayed data signal DQ' only on the rising edges of the clock signal DQS, and therefore may be used with single data rate communication systems (e.g., where the data signals are sampled at the rising edges of the clock signal, but not the falling edges of the clock signal). In a case of a communication system that is sampled on the falling edges of the clock signal, the D flip-flops may be modified by negating the input to the reset pin. In addition, as will be described in more detail below in regard to FIG. 5H, similar circuits may be used to perform late detection by applying the delay line to the clock signal DQS to generate a delayed clock signal DQS' (instead of the delaying the data signal DQ to generate a delayed data signal DQ').

Based on this concept, the early and late detection circuits are shown in FIG. 5E and FIG. 5H, respectively. In particular, the examples of early and late detection circuits shown in FIGS. 5E and 5H include phase detectors that sample on both the rising and falling edges of the clock signal DQS, such that these circuits are applicable to double data rate (DDR) input/output systems (e.g., SerDes and DDR memory).

FIG. 5E shows an early detection circuit 520 between DQS vs. DQ according to one embodiment of the present disclosure, which uses both rising and falling edges of clock signal DQS to sample the data signal DQ and the delayed data signal DQ', where a delay line 521 is used to perform a n delay on the data signal DQ to produce the delayed data signal DQ'. Due to duty-cycle distortion and/or inter-symbol interference (ISI), the DQ unit internals (UIs) sampled by DQS's rising and falling edges may not be equal, or the DQS pulse itself could have unbalanced positive and negative pulse widths due to duty-cycle distortion (e.g., 60/40 distortion, causing the falling edge to be delayed, even if the rising edge stays at the center of the eye). These distortions could affect one or both of DQ and DQS. Therefore, a phase detector 522 (shown in FIG. 5E as four D flip-flops 523-526) performs the detection at both DQS edges (e.g., in the embodiment of FIG. 5E first D flip-flop 523 and second D flip-flop 524 perform phase detection at the rising edge (or positive edge) of DQS in a manner similar to the early detection circuit 510 shown in FIG. 5B, and third D flip-flop 525 and fourth D flip-flop 526 perform phase detection at the falling edge (or negative edge) of DQS). The early signal (or early indicator) is asserted as long as either one of the sampling edges returns with a request for adjustment (e.g., early_neg or early_pos, as determined by the OR gate 527), indicating that the DQS signal is early (e.g., more than a threshold amount of time before a desired point, such as the midpoint of the data eye). This indicates that the DQ delay line needs to be adjusted shorter (or earlier) relative to DQS or the DQS delay line needs to be adjusted longer (or later) relative to DQ (either change would correct the timing issue).

FIG. 5F is a timing diagram showing a case where the rising and falling edges of clock signal DQS are both aligned with the centers of the data eyes of successive data symbols in the data signal DQ, and therefore, at both the rising and falling edges of the clock signal DQS, a given edge of the clock signal samples the same data eye of the data signal DQ (shown in solid lines) and the delayed data signal DQ' (shown in dashed lines). Accordingly, under the conditions shown in FIG. 5F, the early detection circuit 520 would not determine that the early timing margin was at risk in other words, would not determine that the timing margin was violated (e.g., the clock signal was not more than a threshold amount of time before a desired point in the data eye).

However, FIG. 5G shows an example of a case where duty cycle distortion has distorted the data eyes such that the first data eye, which is sampled by the rising edge of the clock signal DQS, is much wider than the second data eye, which is sampled by the falling edge of the clock signal DQS. In this case, the portion of the early detection circuit configured to detect the loss of early timing margin at the rising edge of the clock signal DQS would not generate a request for adjustment (e.g., early_pos would be 0) because, as seen in FIG. 5G, the rising edge of the clock signal passes through the same first data eyes of the data signal DQ (shown in solid lines) and the delayed data signal DQ' (shown in solid lines). However, the falling edge of the clock signal DQS samples from outside the second data eye of the delayed data signal DQ' (shown in dashed lines), and therefore the early detection circuit detects the loss of timing margin at the falling edge (e.g., that the early timing margin is at risk or has been violated at the falling edge because the falling edge of the clock signal DQS is more than a threshold amount before a desired point of the data eye, such as the midpoint of the data eye), thereby causing a request for adjustment (e.g., early_neg would be 1). Accordingly, in the case of FIG. 5G, the early detection circuit 520 would generate a request for early adjustment signal (e.g., a value of 1) or assertion of the early indicator signal.

FIG. 5H shows a late detection circuit 530 between DQS vs. DQ according to one embodiment of the present disclosure. Unlike the case of the early detection circuit shown in FIG. 5E, a delay line 531 is used to add "n delay" to the clock signal DQS to generate its delayed version-delayed clock signal DQS' (instead of adding the "n delay" to the data signal DQ to generate delayed data signal DQ'). For late detection, the hold time margin to the DQS edge is measured using a phase detector 532 (shown in FIG. 5H as four D flip-flops 533-536) configured, in a manner similar to that discussed above, such that a first D flip-flop 533 and a second D flip-flop 534 sample the data signal DQ on the rising edges of the clock signal DQS and the delayed clock signal DQS' to perform late detection on the rising edges (or positive edges) of the clock signal DQS and the delayed clock signal DQS' and a third D flip-flop 535 and a fourth D flip-flop 536 sample the data signal DQ on the falling edges of the clock signal DQS and the delayed clock signal DQS' to perform late detection on the falling edges (or negative edges). The late indicator signal is asserted as long as either one of the sampling edges returns with a request for adjustment (e.g., late_neg or late_pos), indicating that the DQS signal is late (e.g., after a desired point of the data eye, such as the midpoint of the data eye), as determined by the OR gate 537. When the late indicator signal is asserted, it is an indication that the DQS signal is late (e.g., more than a threshold amount after a desired point of the data eye, such as the midpoint of the data eye), and therefore the DQ delay line needs to be adjusted later or the DQS delay line needs to be adjusted earlier (either change would correct the timing issue).

Figure 5I:
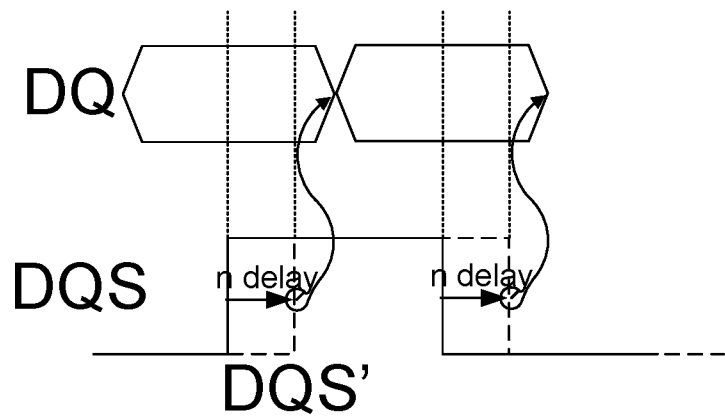
FIG. 5I is a timing diagram showing a case where the rising edges of clock signal DQS and delayed clock signal DQS' are both within the first data eye of the data signal DQ and the falling edges of the clock signal DQS and the delayed clock signal DQS' are also both within the following data eye of the data signal DQ.

FIG. 5I is a timing diagram showing a case where the rising edges of clock signal DQS and delayed clock signal DQS' are both within the first data eye of the data signal DQ and the falling edges of the clock signal DQS and the delayed clock signal DQS' are also both within the following data eye of the data signal DQ.

Figure 5J:
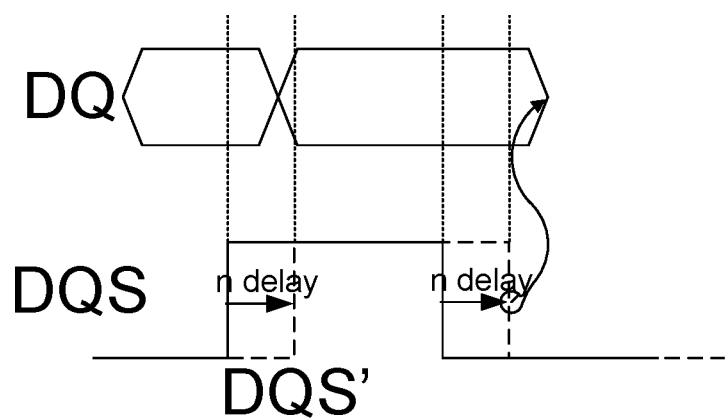
FIG. 5J is a timing diagram depicting a case where the late detection circuit detects that the late timing margin has been violated according to one example of the present disclosure.

However, FIG. 5J shows an example of a case where duty cycle distortion has distorted the data eyes such that the first data eye, which is sampled by the rising edge of the clock signal DQS, is much narrower than the second data eye, which is sampled by the falling edge of the clock signal DQS. In this case, the portion of the late detection circuit configured to detect the loss of timing margin at the falling edge would not generate a request for adjustment (e.g., late_neg would be 0) because, as seen in FIG. 5J, the falling edge of the clock signal DQS and the delayed clock signal DQS' both pass through the second data eye of the data signal DQ. However, the rising edge of the delayed clock signal DQS' samples from outside the first data eye DQ, and therefore the late detection circuit detects the loss of timing margin at the rising edge, thereby causing a request for adjustment (e.g., late_pos would be 1). Accordingly, in the case of FIG. 5J, the late detection circuit 530 would generate a request for late adjustment signal or an assertion of the late indicator signal (e.g., a value of 1).

While FIG. 5G and FIG. 5J depict examples of duty cycle distortion in the data signal, embodiment of present disclosure are not limited to detecting these types of conditions, but may also detect other conditions where the timing margin is reduced, such as the examples of DVFS scaling as shown in FIG. 4B and FIG. 4C, and such as the case where one or both of the data signal DQ and the clock signal DQS suffer from duty cycle distortion and/or inter-symbol interference (ISI).

Figure 6A:
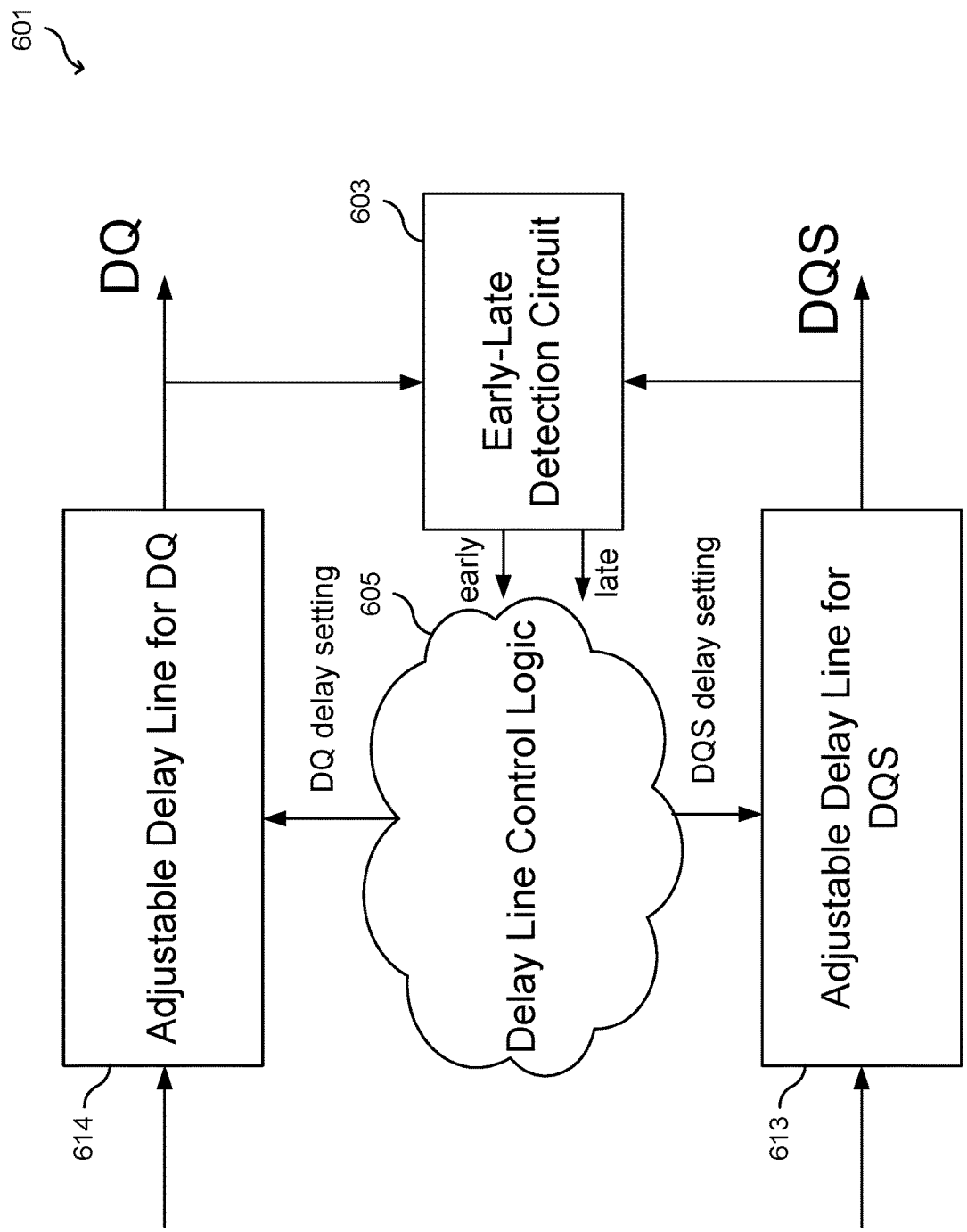
FIG. 6A is a block diagram of a closed-loop delay line adjustment system based on early-late detection according to one embodiment of the present disclosure.

FIG. 6A is a block diagram of a closed-loop delay line adjustment circuit 601 based on an early-late detection circuit 603 according to one embodiment of the present disclosure. FIG. 6A shows an example of how the adjustable delay lines 613 and 614 are adjusted by a delay line control logic circuit 605 in accordance with early and late signals (or early and late indicator signals) generated by early-late detection circuit 603 (which may be implemented by, for example, the circuits described above with respect to FIGS. 5B, 5E, and 5H) based on the data signal DQ and clock signal DQS. In a DQS vs. DQ input/output system circuit 100 such as that shown in FIG. 1, the early-late detection circuit 603 can be added next to the adjustable delay line design (e.g., adjustable delay lines 110 described in FIG. 1) to support the feature of automatic tracking. (FIG. 6C, described in more detail below, shows a closed-loop delay line adjustment circuit 601 in the context of an input/output circuit 600.) In some embodiments, the early detection circuit included in the early-late detection circuit 603 may be implemented as described above with respect to FIG. 5E, and the late detection circuit may be implemented as described above with respect to FIG. 5H. The adjustable delay lines for DQ and DQS may be implemented as in FIG. 3 with the DQ/DQS delay setting input into the MUX of FIG. 3, although it is appreciated that other types of adjustable delay line circuits may be implemented without deviating from the scope of the present disclosure. The delay line control logic circuit 605 receives the early and late adjustment request signals (or early and late indicator signals) from the early-late detection circuit 603 and controls the DQS delay setting on the DQS read adjustable delay line 613 and the DQ delay setting on the DQ read adjustable delay line 614 based on those early and late adjustment request signals (or early and late indicator signals). Methods for controlling the settings based on the request signals will be described in more detail below with respect to FIG. 7A, FIG. 7B, and FIG. 7C.

Figure 6B:
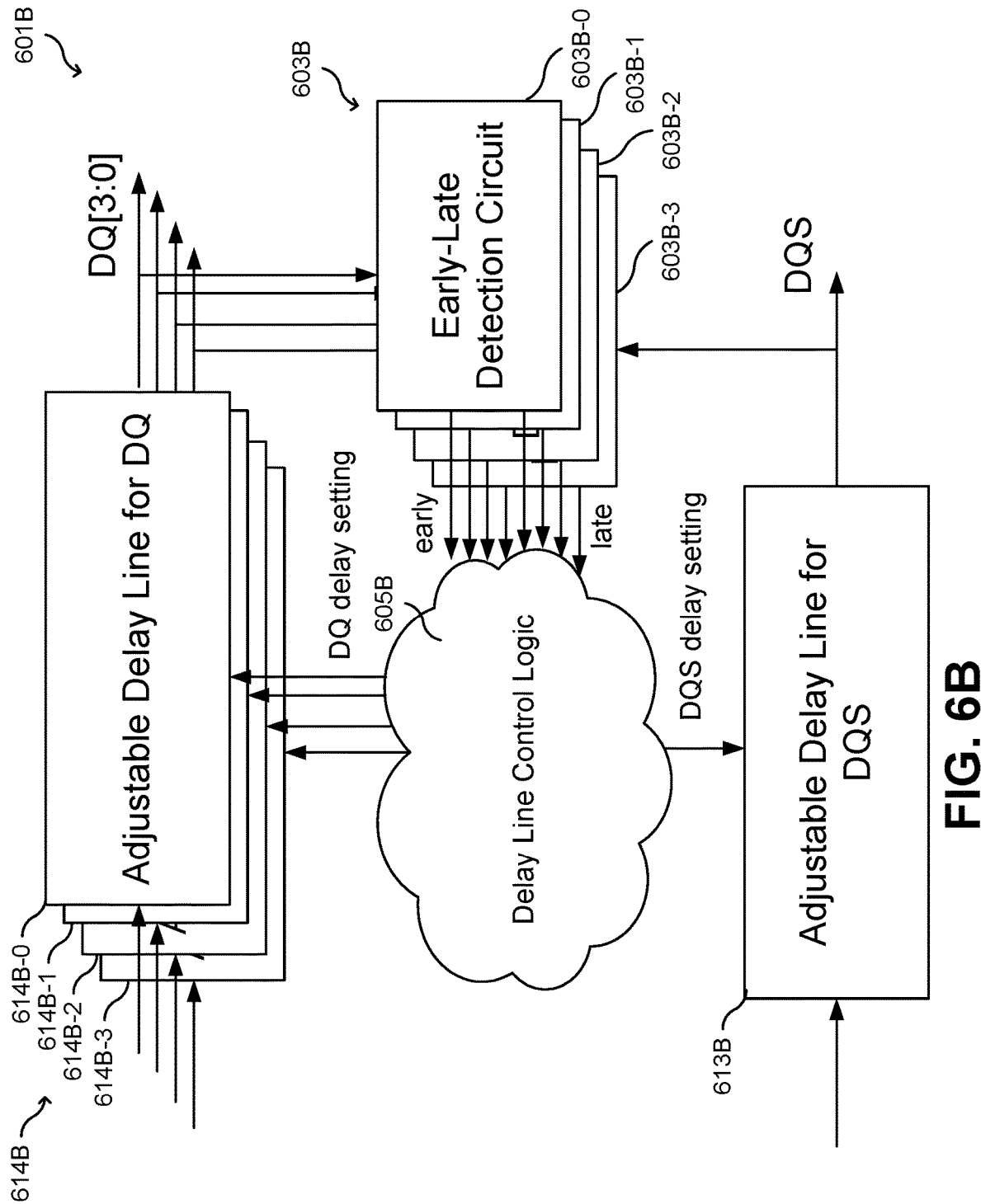
FIG. 6B is a block diagram of an expandable automatic tracking system with 4 data (DQ) bits and 1 clock signal (DQS) shared by the 4 data bits.

FIG. 6B is a block diagram of an expandable automatic tracking system with 4 data (DQ) bits DQ[3:0] and 1 clock signal (DQS) shared by the 4 data bits. Because all four data bits share the same clock signal DQS, there is only one adjustable delay line for DQS 613B and there are four separate adjustable delay lines 614B-one for each of the four DQ bits, labeled 614B-0, 614B-1, 614B-2, and 614B-3. There is a separate early-late detection circuit 603B for each of the data bits, labeled 603B-0, 603B-1, 603B-2, and 603B-3, where each early-late detection circuit 603B takes a corresponding one of the DQ signals (e.g., DQ[0], DQ[1], DQ[2], or DQ[3]) and the shared DQS signal and generates corresponding early and late indicator signals (or early and late adjustment request signals), to be supplied to the delay line control logic 605B. The delay line control logic 605B generates a separate DQ delay setting for each of the DQ read adjustable delay lines 614B as well as a DQS delay setting for the adjustable delay line for DQS 613B. A system 601B with 4 DQ bits is shown merely as an example, and embodiments of the present disclosure include the case of more than 4 DQ bits sharing 1 clock signal DQS based on the same concept.

Figure 6C:
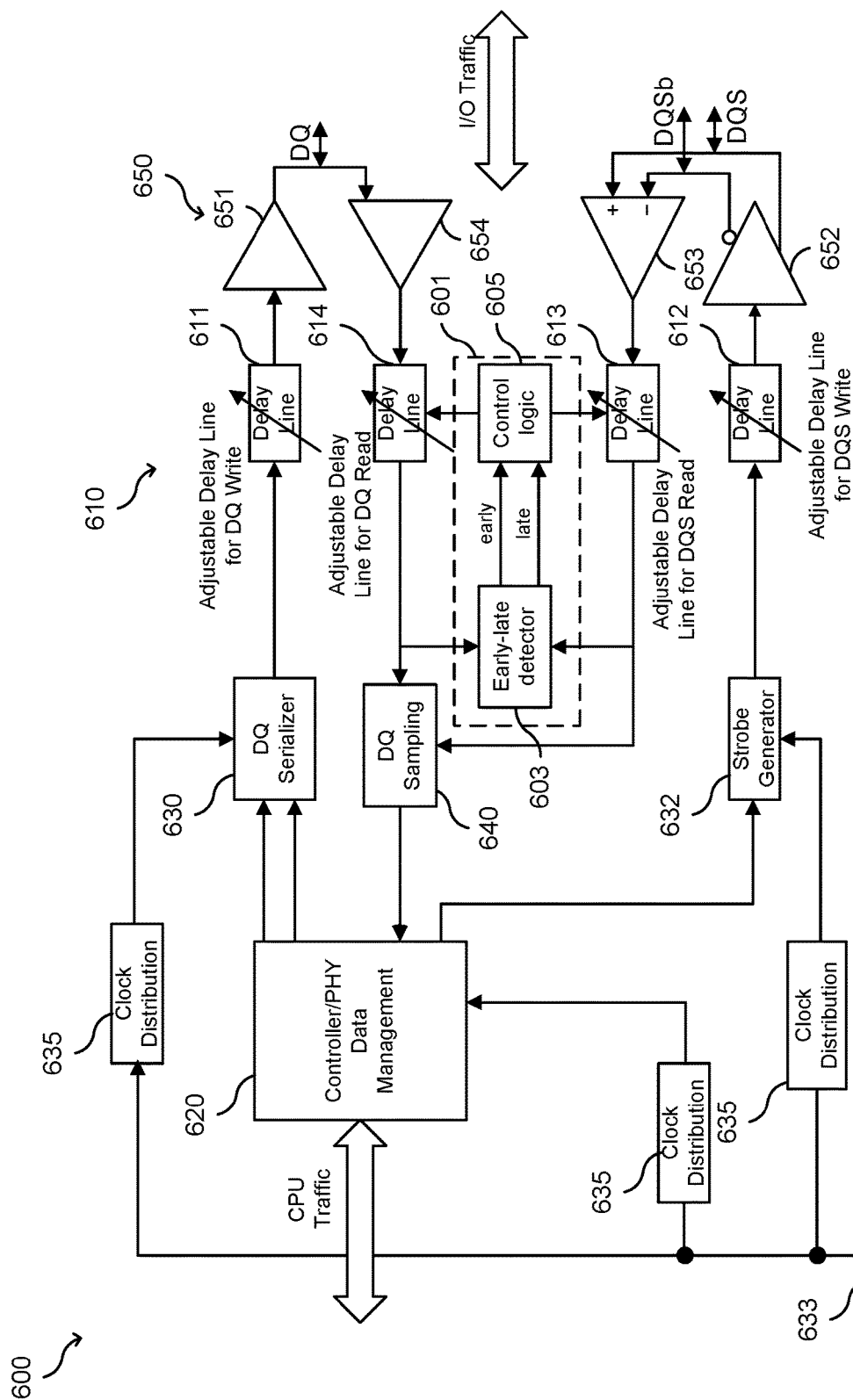
FIG. 6C illustrates a block diagram of an input/output circuit including adjustable delay lines to synchronize clock (DQS) and data (DQ) signals, as controlled by a circuit according to embodiments of the present disclosure.

FIG. 6C illustrates a block diagram of an input/output circuit 600 including adjustable delay lines 610 to synchronize clock (DQS) and data (DQ) signals, as controlled by a closed-loop delay line adjustment circuit 601 according to embodiments of the present disclosure. In the example input/output circuit 600 shown in FIG. 6C, input/output (I/O) traffic is transmitted and received (e.g., interacting with a memory or a serial communication line). For the sake of discussion, the example shown in FIG. 6C may operate in a half-duplex manner, where the input/output circuit 600 may operate in a receive mode or a transmit mode. When operating in a transmit mode, data received from a central processing unit (CPU) may be received at a controller/ physical layer (PHY) data management controller 620. The data to be transmitted may be provided to a DQ serializer 630, which serializes the data and provides the serialized data to an adjustable delay line for data writes (a DQ write adjustable delay line 611). The controller 620 also controls a strobe generator 632, which takes in an internal clock signal 633 from a clock distribution network 635 and which outputs a clock signal or strobe signal DQS. This strobe signal may similarly be delayed by an adjustable delay line for the strobe write (a DQS write adjustable delay line 612), where the adjustable delay lines for the DQ write and the DQS write are adjusted such that the data signal DQ and the strobe signal DQS are synchronized (e.g., using an early-late detector according to embodiments of the present disclosure). The delayed data DQ and the delayed clock signal DQS are then supplied as part of the I/O traffic (after being appropriately amplified by a corresponding amplifier 650, including input/output amplifiers 651 and 654 for DQ and input/output amplifiers 652 and 653 for DQS). While a closed-loop delay line adjustment circuit according to embodiments of the present disclosure may be applied to a transmitter side of an input/output device to improve the alignment of data signal DQ and strobe signal DQS before transmission (e.g., on an I/O bus over which the I/O traffic flows), the embodiment of FIG. 6C does not explicitly illustrate such an arrangement.

When operating in a receive mode, a data signal DQ and a clock or strobe signal DQS are received as part of the I/O traffic (e.g., from a memory device or a communications link). The received data signal DQ and received strobe signal DQS may be amplified by corresponding ones of the amplifiers 650 and the received data signal DQ is sampled by a DQ sampling circuit 640 using the received strobe signal DQS. Before the received strobe signal DQS is supplied to the DQ sampling circuit 640, it may first be delayed by a DQS read adjustable delay line 613 and the received data signal DQ is supplied to a DQ read adjustable delay line 614. The delayed strobe signal DQS and the delayed data signal DQ are supplied to the early-late detection circuit 603 of the closed-loop delay line adjustment circuit 601, which generates early/late adjustment request signals or early/late indicator signals (as discussed above), which are supplied to the delay line control logic circuit 605 to control the settings of the DQS read adjustable delay line 613 and DQ read adjustable delay line 614 in order to maintain a timing margin between the data signal DQ and the strobe signal DQS. The data signal sampled by the DQ sampling circuit 640 is supplied to the controller 620, which can supply the data to the CPU (e.g., over an internal bus).

The embodiments shown in the example of FIG. 6C, the input to the early-late detector corresponding to the data signal DQ is taken from the output of the DQ read adjustable delay line 614. However, in some circumstances, the DQ read adjustable delay line 614 cannot be placed before the DQ sampling 640 because the voltage swing of the data signal DQ is not sufficiently large to pass through a delay line. Therefore, in some embodiments of the present disclosure, the specific delays for each data bit (e.g., the different data bits DQ[3:0] as shown in FIG. 6B) are applied to the strobe signal DQS to provide the DQ sampling circuit 640 with a different strobe signal for each bit.

Figure 6D:
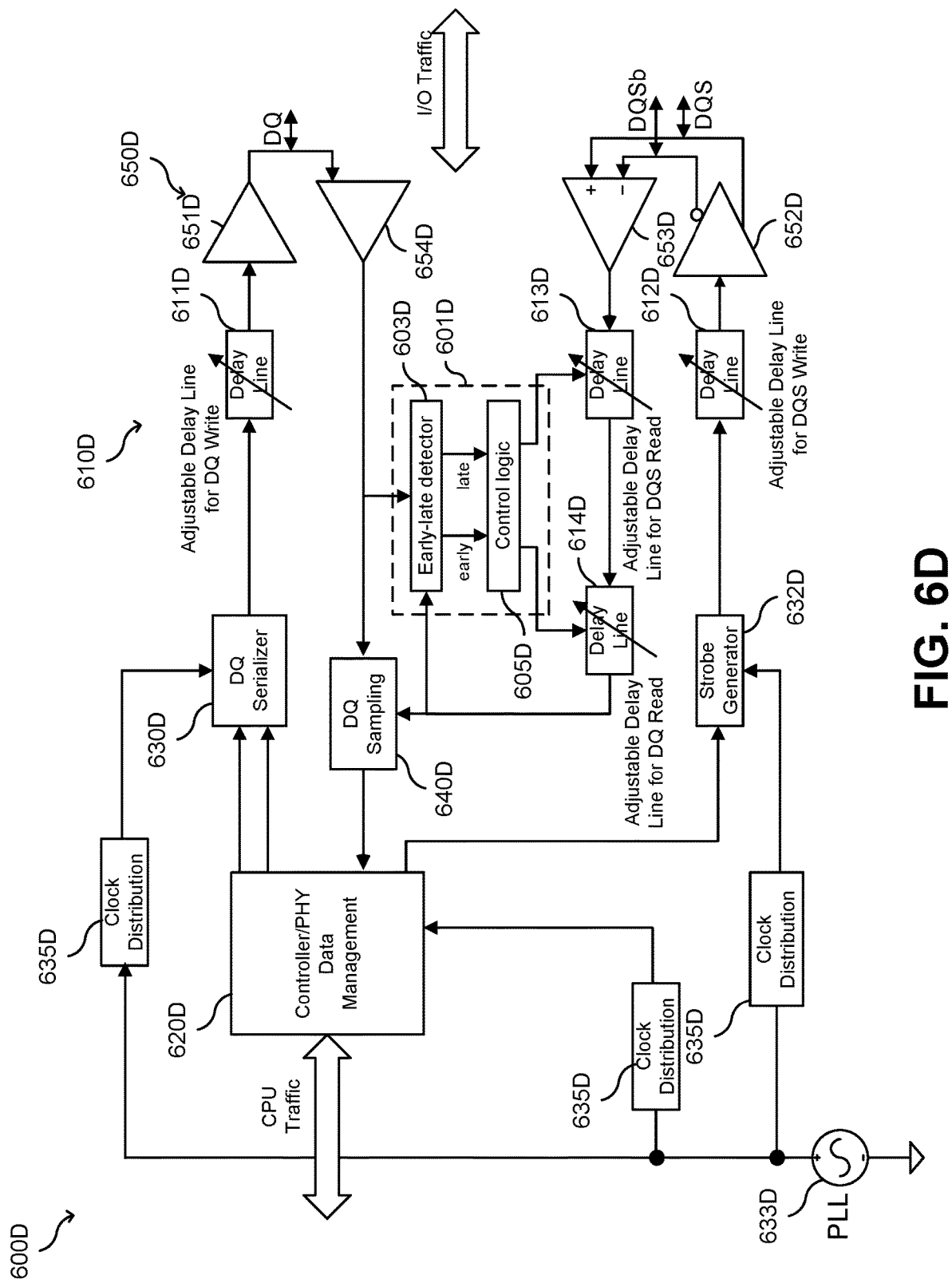
FIG. 6D illustrates a block diagram of an input/output circuit including adjustable delay lines to synchronize clock (DQS) and data (DQ) signals, as controlled by a circuit according to embodiments of the present disclosure.

FIG. 6D illustrates a block diagram of an input/output circuit 600D including adjustable delay lines 610D to synchronize clock (DQS) and data (DQ) signals, as controlled by a circuit according to embodiments of the present disclosure. In the example input/output circuit 600D shown in FIG. 6D, input/output (I/O) traffic is transmitted and received (e.g., interacting with a memory or a serial communication line). For the sake of discussion, like the example shown in FIG. 6C, the example of FIG. 6D may operate in a half-duplex manner, where the input/output circuit 600D may operate in a receive mode or a transmit mode. When operating in a transmit mode, data received from a central processing unit (CPU) may be received at a controller/physical layer (PHY) data management controller 620D. The data to be transmitted may be provided to a DQ serializer 630D, which serializes the data and provides the serialized data to an adjustable delay line for data writes (a DQ write adjustable delay line 611D). The controller 620D also controls a strobe generator 632D, which takes in an internal clock signal 633D from a clock distribution network 635D and which outputs a clock signal or strobe signal DQS. This strobe signal may similarly be delayed by an adjustable delay line for the strobe write (a DQS write adjustable delay line 612D), where the adjustable delay lines for the DQ write and the DQS write are adjusted such that the data signal DQ and the strobe signal DQS are synchronized (e.g., using an early-late detector according to embodiments of the present disclosure). The delayed data DQ and the delayed clock signal DQS are then supplied as part of the I/O traffic (after being appropriately amplified by a corresponding amplifier 650D, including input/output amplifiers 651D and 654D for DQ and input/output amplifiers 652D and 653D for DQS). While a closed-loop delay line adjustment circuit according to embodiments of the present disclosure may be applied to a transmitter side of an input/output device to improve the alignment of data signal DQ and strobe signal DQS before transmission (e.g., on an I/O bus over which the I/O traffic flows), the embodiment of FIG. 6C does not explicitly illustrate such an arrangement.

When operating in a receive mode, a data signal DQ and a clock or strobe signal DQS are received as part of the I/O traffic (e.g., from a memory device or a communications link). The received data signal DQ and received strobe signal DQS may be amplified by corresponding ones of the amplifiers 650D and the received data signal DQ is sampled by a DQ sampling circuit 640D using the received strobe signal DQS. Before the received strobe signal DQS is supplied to the DQ sampling circuit 640D, it may first be delayed by a DQS read adjustable delay line 613D and further delayed by a DQ read adjustable delay line 614D. In embodiments of the present disclosure, the DQ read adjustable delay line 614D includes separate adjustable delay lines for each data bit (e.g., the different data bits DQ[3:0] as shown in FIG. 6B), such that a separate delayed strobe signal DQS is provided to the DQ sampling circuit 640 of each data bit DQ. These delayed strobe signals DQS are also provided to the early-late detection circuit 603D as the strobe signal DQS input, such that the early-late detection circuit 603D tracks the impact of the delay settings on the alignment of the delayed strobe signals DQS and their corresponding data signals DQ. As such, the delayed strobe signal DQS and the data signal DQ are supplied to the early-late detection circuit 603D of the closed-loop delay line adjustment circuit 601D, which generates early/late adjustment request signals or early/late indicator signals (as discussed above), which are supplied to control logic 605D to control the settings of the DQS read adjustable delay line 613D and DQ read adjustable delay line 614D in order to maintain a timing margin between the data signal DQ and the strobe signal DQS. The data signal sampled by the DQ sampling circuit 640D is supplied to the controller 620D, which can supply the data to the CPU (e.g., over an internal bus).

The delay line control logic circuit 605 shown in FIG. 6A, FIG. 6B, FIG. 6C, and FIG. 6D contains the training sequence and process of automatic tracking and calibration based on the live traffic during regular operation according to some aspects of embodiments of the present disclosure. This delay line control logic can be implemented in either hardware or software or combinations thereof, depending on the specific application requirements and design constraints. For example, the delay line control logic may be implemented as an application-specific integrated circuit (ASIC), a field programmable gate array (FPGA), a general-purpose processor executing instructions stored in memory (e.g., firmware), or the like. An overall algorithm is described in more detail with respect to FIGS. 7A, 7B, and 7C, below.

Figure 7A:
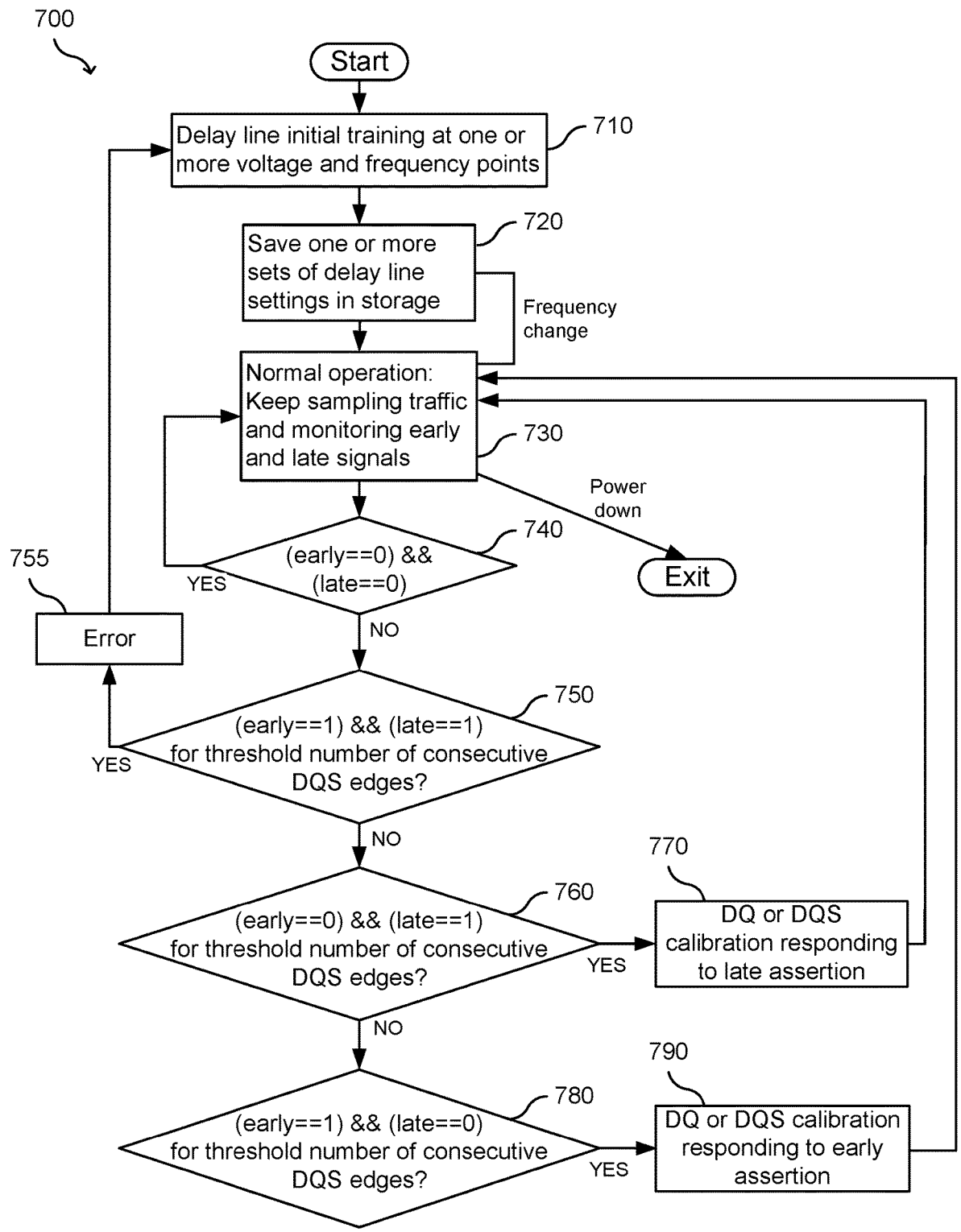
FIG. 7A is a flowchart depicting a method for continuous automatic tracking according to one embodiment of the present disclosure.

FIG. 7A is a flowchart depicting a method 700 for continuous automatic tracking according to one embodiment of the present disclosure. As discussed above, in some embodiments, the delay line control logic circuit 605 implements some or all of the functionality described herein with respect to the method 700. At 710, the delay line control logic performs an initial training of the delay line setting at one or more voltage and frequency points (e.g., different profiles as discussed above with respect to FIG. 4A), where these initial delay line settings align the strobe signal DQS and the data signal DQ at various voltages and frequencies. At 720, the delay line control logic stores the one or more sets of delay line settings that were determined during the initial training at 710 in storage (e.g., a memory connected to the delay line control logic). During normal operation, the early-late detection circuit 603 samples the input/output traffic and monitors the timing margin based on that sampling of the data signal DQ (or multiple data signals) and the strobe signal DQS, and at 730 the delay line control logic circuit 605 monitors for early and late adjustment request signals or early and late indicator signals from the early-late detection circuit 603. At 740, the delay line control logic circuit 605 determines whether both the early and late indicator signals are unasserted (e.g., both have value 0). In such a case, no adjustment is needed, and the delay line control logic circuit 605 returns to monitoring at 730. At 750, the delay line control logic circuit 605 determines whether both the early and late indicator signals are asserted for a threshold number of DQS edges such as a threshold number of consecutive DQS edges (e.g., 4 consecutive DQS edges). If so, then the delay line control logic circuit 605 determines that the system is in an error condition at 755 and returns to restart a training process at 710. At 760, the delay line control logic circuit 605 determines whether only the late indicator signal was asserted for the threshold number of DQS edges. In response to determining that only the late indicator signal is asserted, the delay line control logic circuit 605 performs DQ or DQS calibration in response to the late indicator signal assertion at 770, where the calibration is described in more detail below with respect to FIG. 7B. At 780, the delay line control logic circuit 605 determines that the early indicator signal was asserted for the threshold number of DQS edges, in which case the delay line control logic circuit 605 performs DQ or DQS calibration responding to early assertion or early indicator at 790, where the calibration is described in more detail below with respect to FIG. 7C. In the case of receiving a power down signal at 730, the delay line control logic circuit 605 shuts down and the process terminates.

When an early or late indicator signal is asserted, delay line adjustment is needed depending on the margin range setup from "n delay" which is also programmable based on a system's margin requirement. As "n delay" is made of the same delay element design used by DQS and DQ delay lines, the delay amount on the basic delay component (Tintr and Ttap) used by "n delay" is also susceptible to voltage and temperature variation over time. In order to keep the required margin range constant even after factoring in variation, the same delay line calibration using delay-locked loop (DLL) at time 0 and time t can also be used here so that the absolute delay amount from "n delay" can be maintained constant over time.

In the embodiment shown in FIG. 7A, four consecutive DQS edge sampling is shown to ensure a steady early or late indicator signal. This is to avoid any random jitter or temporal noise which may cause mis-triggering in the system. The number or amount of oversampling can also be adjusted to be values other than four (e.g., less than four or more than four) depending on the stability of the input/output communication system.

As shown in FIG. 6B, there may be multiple DQ bits sampled by one DQS in a small closed-loop system. Adjusting an individual DQ delay line will have only a local impact on the relative timing between that DQ bit and the clock DQS (e.g., only one of the DQ bits shown in FIG. 6B). On the other hand, adjusting the DQS delay line will impact the timing of all of the DQ bits that are associated with that clock DQS (e.g., all four DQ bits shown in FIG. 6B). Therefore, in some embodiments, the delay line control logic adjusts each individual DQ delay line first to meet each DQ bit's requirement rather than adjusting the DQS delay line in order to avoid impacting the timing of all associated DQ bits. However, if a DQ delay line has reached its minimum or maximum delay limit, then the DQS delay line can then be adjusted as a second resort. This may cause other DQ bits to fall out of timing alignment, thereby requiring those other DQ delay lines to be further adjusted. The priority of the delay line adjustment in the case where the adjustable delay line for DQ is connected to the signal path for the data signal DQ (e.g., in embodiments similar to that shown in FIG. 6C) is also shown in FIG. 7B and FIG. 7C, and the priority of the delay line adjustment in a case where the adjustable delay line for DQ is connected to the signal path for the strobe signal DQS (e.g., in embodiments similar to that shown in FIG. 6D) is shown in FIG. 7D and FIG. 7E.

Figure 7B:
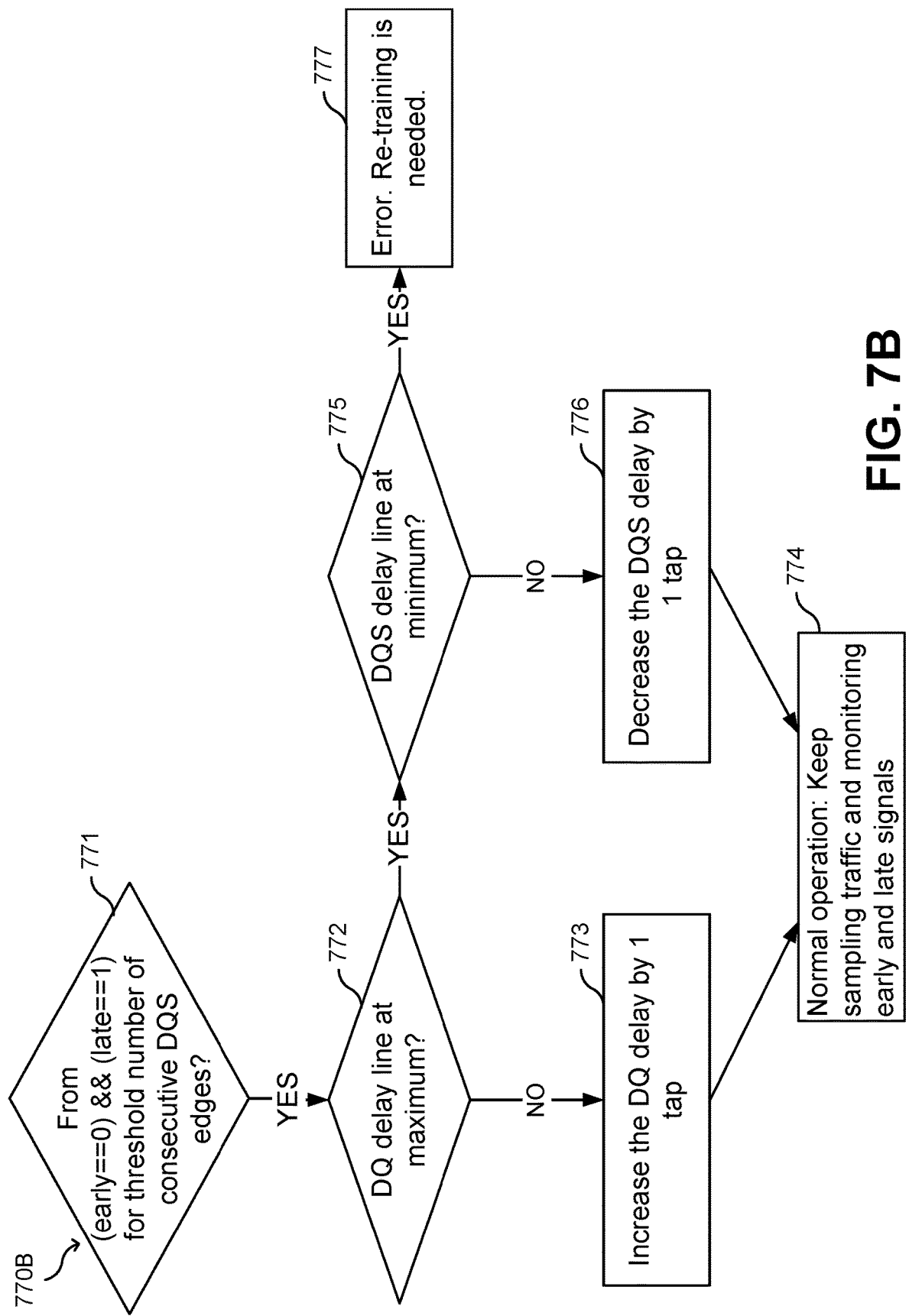
FIG. 7B is a flowchart depicting details of controlling one or more adjustable delay lines in response to detecting a late indicator signal assertion according to one embodiment of the present disclosure.

FIG. 7B is a flowchart depicting details of controlling one or more adjustable delay lines in response to detecting a late indicator signal assertion according to one embodiment of the present disclosure and is applicable to cases where the DQ delay line and the DQS delay line are respectively connected to the signal path for the data signal DQ and the signal path for the strobe signal DQS (e.g., in the embodiment shown in FIG. 6C). The method 770B for controlling the adjustable delay lines begins from determining, at 771, that the late indicator signal has been asserted (e.g., late=1) and that the early indicator signal was not asserted (e.g., early=0). In some embodiments, this corresponds to the determination at 760 in the embodiment shown in FIG. 7A. As noted above, in some embodiments, the delay line control logic attempts to adjust the individual adjustable delay line corresponding to each DQ bit first. As such, at 772, the delay line control logic determines whether the DQ delay line is at its maximum. In a case where the DQ delay line is not at its maximum, the delay line control logic increases the DQ delay by one tap (e.g., one increment, such as a small incremental change that may include two or more taps or the smallest incremental change that may include exactly one tap, or another increment in the case of an adjustable delay line that does not use taps taken from a chain of delay elements) at 773, then resumes normal operation at 774 (e.g., in some embodiments, this corresponds to returning to normal operation at 730 of FIG. 7A). In a case where the DQ delay line is determined, at 772, to be at a maximum, the DQ delay line cannot be adjusted further, and therefore the delay line control logic attempts to adjust the DQS delay setting for the DQS delay line. In more detail, at 775, the delay line control logic determines whether the DQS delay line is at its minimum value. In response to determining that the DQS delay line is not set to its minimum value, the delay line control logic decreases the DQS delay setting on the DQS delay line by one tap (e.g., a small incremental change or the smallest incremental change) at 776, and then returns to normal operation at 774. In a case where the DQS delay line is determined to be at its minimum value at 775, then there is no further adjustment possible, and the delay line control logic determines that retraining of the delay line settings is needed at 777. In some embodiments, this results in returning to perform the delay line initial training again at 710, as shown in FIG. 7A.

Figure 7C:
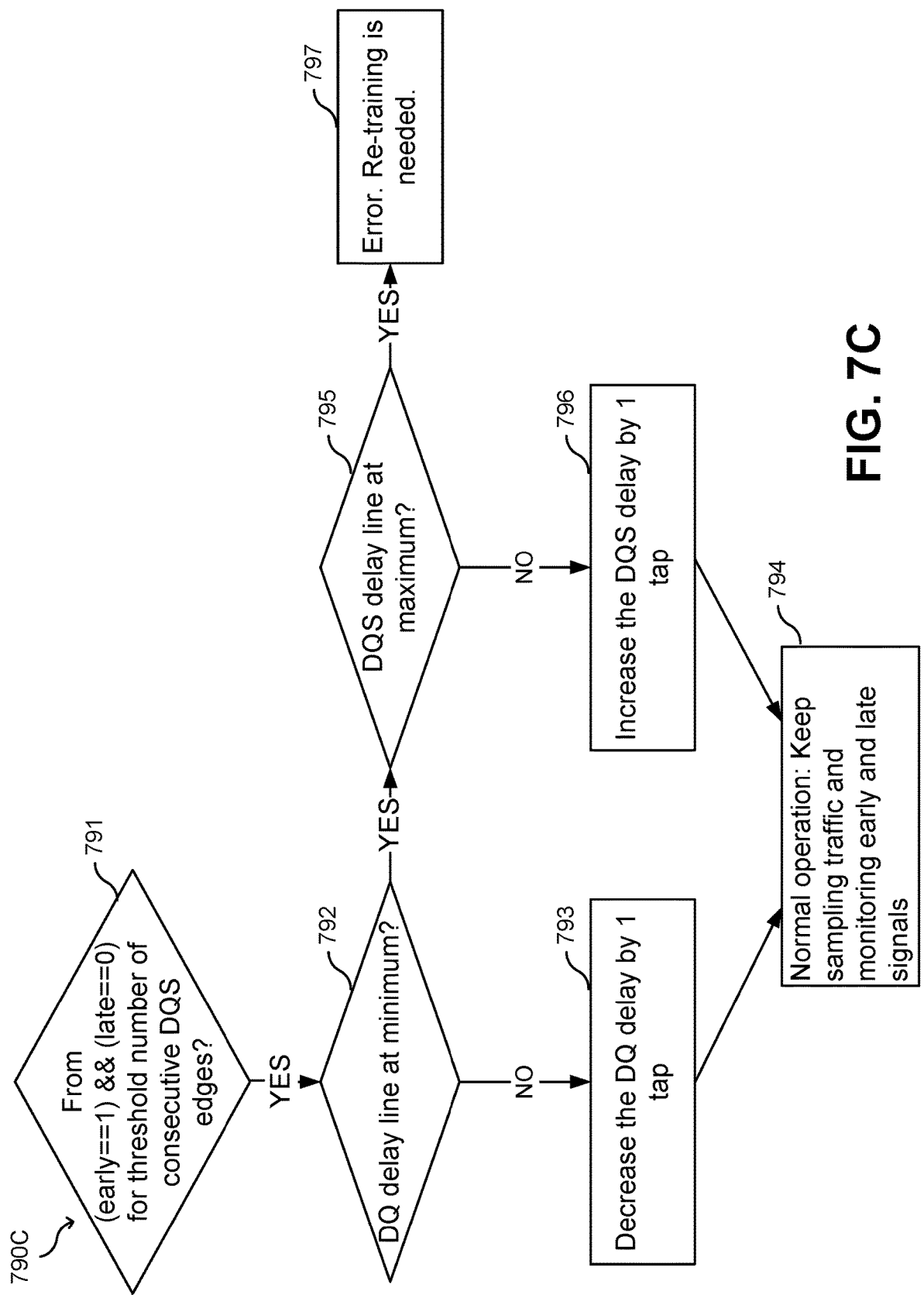
FIG. 7C is a flowchart depicting details of controlling one or more adjustable delay lines in response to detecting an early indicator signal assertion according to one embodiment of the present disclosure.

FIG. 7C is a flowchart depicting details of controlling one or more adjustable delay lines in response to detecting an early indicator signal assertion according to one embodiment of the present disclosure and is applicable to cases where the DQ delay line and the DQS delay line are respectively connected to the signal path for the data signal DQ and the signal path for the strobe signal DQS (e.g., in the embodiment shown in FIG. 6C). The method 790C for controlling the adjustable delay lines begins from determining, at 791, that the early indicator signal has been asserted (e.g., early==1) and that the late indicator signal was not asserted (e.g., late==0). In some embodiments, this corresponds to the determination at 780 in the embodiment shown in FIG. 7A. As noted above, in some embodiments, the delay line control logic attempts to adjust the individual adjustable delay line corresponding to each DQ bit first. As such, at 792, the delay line control logic determines whether the DQ delay line is at its minimum. In a case where the DQ delay line is not at its minimum, the delay line control logic decreases the DQ delay by one tap (e.g., a small incremental change or the smallest incremental change) at 793, then resumes normal operation at 794 (e.g., in some embodiments, this corresponds to returning to normal operation at 730 of FIG. 7A). In a case where the DQ delay line is determined, at 792, to be at its minimum, the DQ delay line cannot be adjusted further, and therefore the delay line control logic attempts to adjust the DQS delay setting for the DQS delay line. In more detail, at 795, the delay line control logic determines whether the DQS delay line is at its maximum value. In response to determining that the DQS delay line is not set to its maximum value, the delay line control logic increases the DQS delay setting on the DQS delay line by one tap (e.g., a small incremental change or the smallest incremental change) at 796, and then returns to normal operation at 794. In a case where the DQS delay line is determined to be at its maximum value at 795, there is no further adjustment possible, and the delay line control logic determines that retraining of the delay line settings is needed at 797. In some embodiments, this results in returning to perform the delay line initial training again at 710, as shown in FIG. 7A.

Figure 7D:
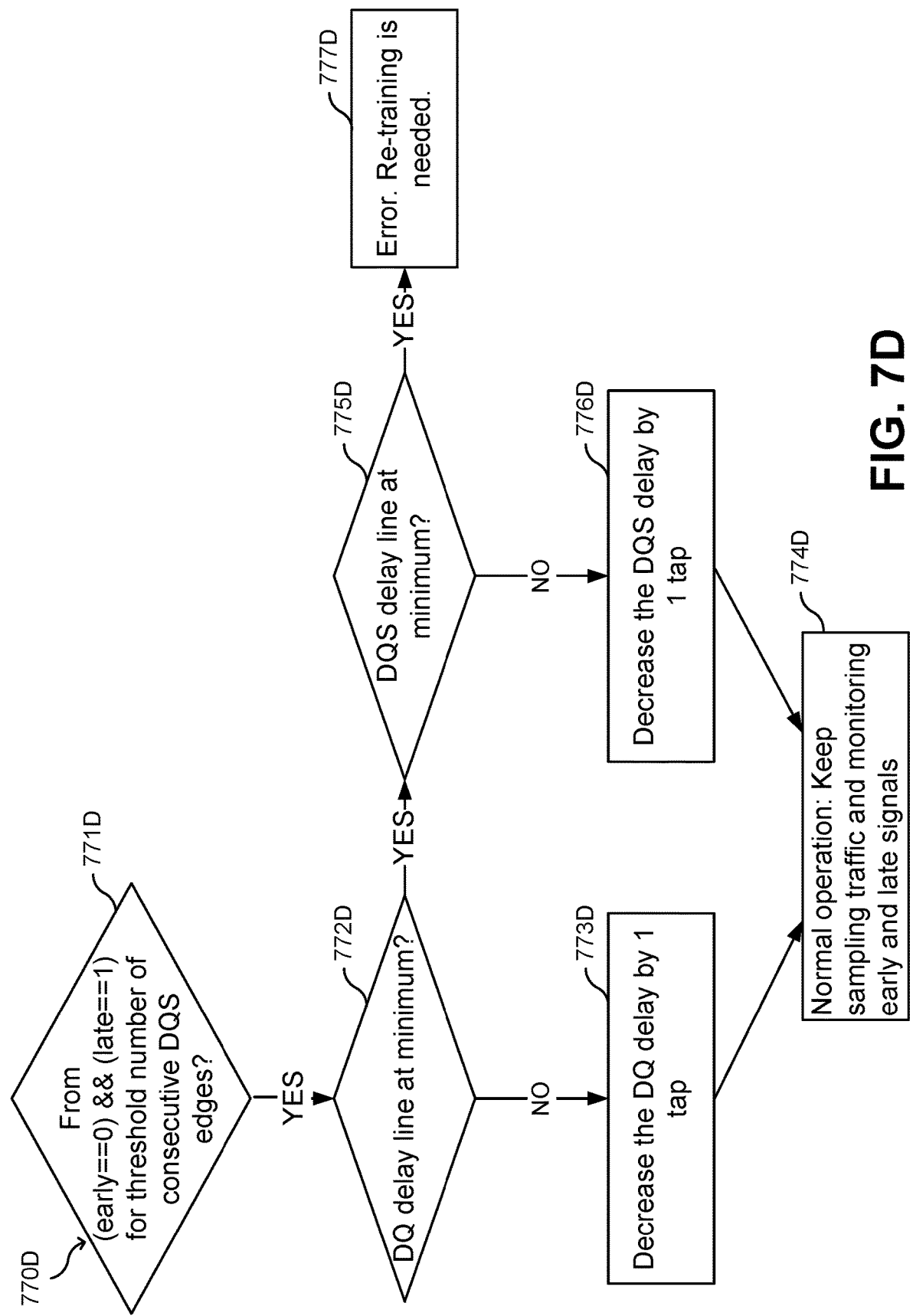
FIG. 7D is a flowchart depicting details of controlling one or more adjustable delay lines in response to detecting a late indicator signal assertion according to one embodiment of the present disclosure.
Figure 7E:
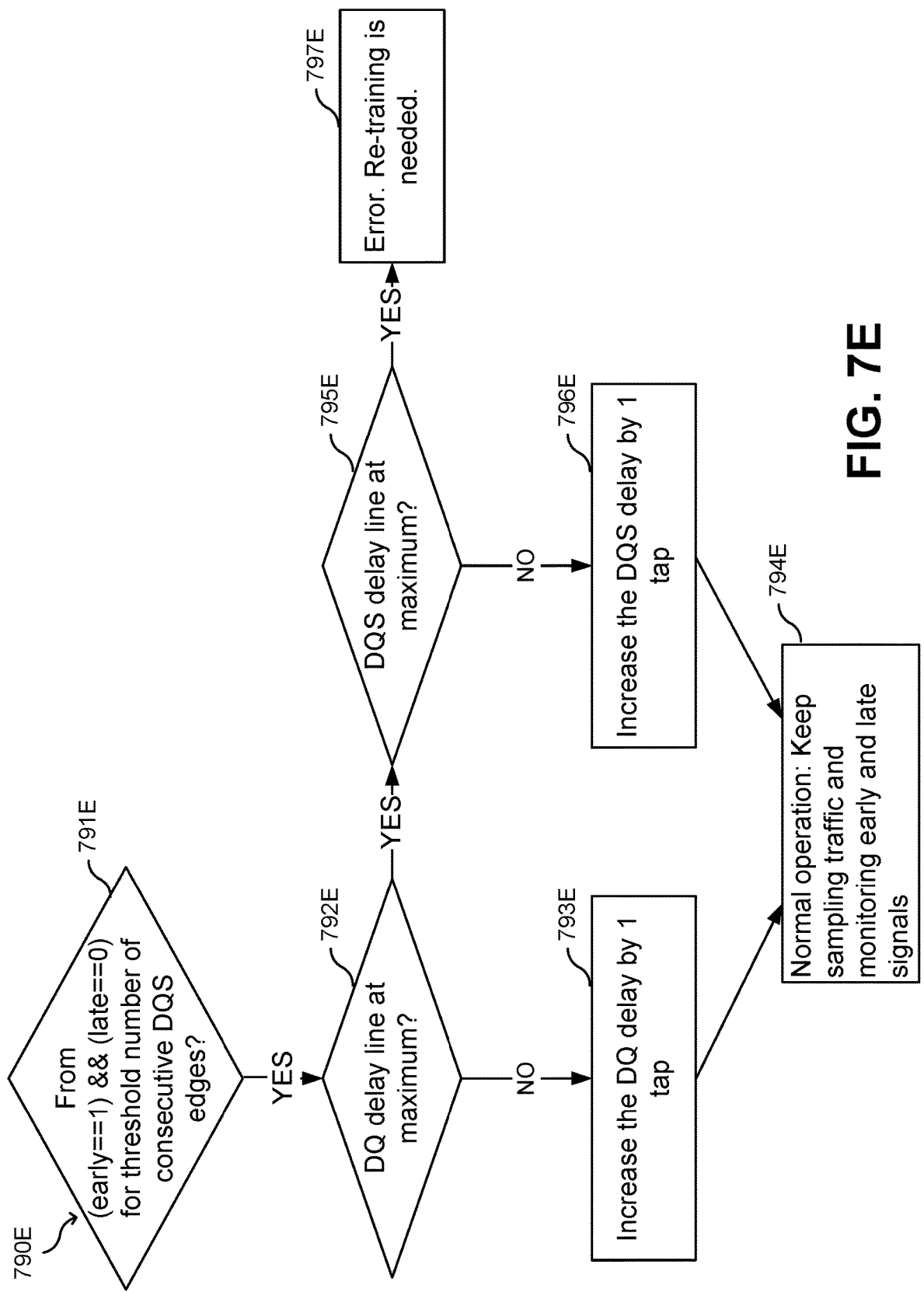
FIG. 7E is a flowchart depicting details of controlling one or more adjustable delay lines in response to detecting an early indicator signal assertion according to one embodiment of the present disclosure.

FIG. 7D is a flowchart depicting details of controlling one or more adjustable delay lines in response to detecting a late indicator signal assertion according to one embodiment of the present disclosure and is applicable to cases where the DQ delay line and the DQS delay line are cascaded and connected to the same signal path corresponding to the strobe signal DQS (e.g., in the embodiment shown in FIG. 6D). The method 770D for controlling the adjustable delay lines begins from determining, at 771D, that the late indicator signal has been asserted (e.g., late==1) and that the early indicator signal was not asserted (e.g., early==0). In some embodiments, this corresponds to the determination at 760 in the embodiment shown in FIG. 7A. As noted above, in some embodiments, the delay line control logic attempts to adjust the individual adjustable delay line corresponding to each DQ bit first. As such, at 772D, the delay line control logic determines whether the DQ delay line is at its minimum. In a case where the DQ delay line is not at its minimum, the delay line control logic decreases the DQ delay by one tap (e.g., a small incremental change or the smallest incremental change) at 773D, then resumes normal operation at 774D (e.g., in some embodiments, this corresponds to returning to normal operation at 730 of FIG. 7A). In a case where the DQ delay line is determined, at 772D, to be at its minimum, the DQ delay line cannot be adjusted further, and therefore the delay line control logic attempts to adjust the DQS delay setting for the DQS delay line. In more detail, at 775D, the delay line control logic determines whether the DQS delay line is at its minimum value. In response to determining that the DQS delay line is not set to its minimum value, the delay line control logic decreases the DQS delay setting on the DQS delay line by one tap (e.g., a small incremental change or the smallest incremental change) at 776D, and then returns to normal operation at 774D. In a case where the DQS delay line is determined to be at its minimum value at 775D, then there is no further adjustment possible, and the delay line control logic determines that retraining of the delay line settings is needed at 777D. In some embodiments, this results in returning to perform the delay line initial training again at 710, as shown in FIG. 7A.

FIG. 7E is a flowchart depicting details of controlling one or more adjustable delay lines in response to detecting an early indicator signal assertion according to one embodiment of the present disclosure and is applicable to cases where the DQ delay line and the DQS delay line are cascaded and connected to the same signal path corresponding to the strobe signal DQS (e.g., in the embodiment shown in FIG. 6D). The method 790E for controlling the adjustable delay lines begins from determining, at 791E, that the early indicator signal has been asserted (e.g., early==1) and that the late indicator signal was not asserted (e.g., late==0). In some embodiments, this corresponds to the determination at 780 in the embodiment shown in FIG. 7A. As noted above, in some embodiments, the delay line control logic attempts to adjust the individual adjustable delay line corresponding to each DQ bit first. As such, at 792E, the delay line control logic determines whether the DQ delay line is at its maximum. In a case where the DQ delay line is not at its maximum, the delay line control logic increases the DQ delay by one tap (e.g., a small incremental change or the smallest incremental change) at 793E, then resumes normal operation at 794E (e.g., in some embodiments, this corresponds to returning to normal operation at 730 of FIG. 7A). In a case where the DQ delay line is determined, at 792E, to be at its maximum, the DQ delay line cannot be adjusted further, and therefore the delay line control logic attempts to adjust the DQS delay setting for the DQS delay line. In more detail, at 795E, the delay line control logic determines whether the DQS delay line is at its maximum value. In response to determining that the DQS delay line is not set to its maximum value, the delay line control logic increases the DQS delay setting on the DQS delay line by one tap (e.g., a small incremental change or the smallest incremental change) at 796E, and then returns to normal operation at 794E. In a case where the DQS delay line is determined to be at its maximum value at 795E, there is no further adjustment possible, and the delay line control logic determines that retraining of the delay line settings is needed at 797E. In some embodiments, this results in returning to perform the delay line initial training again at 710, as shown in FIG. 7A.

As noted above, in some embodiments, such as those shown in FIG. 7B and FIG. 7C, the timing is adjusted one delay tap at a time, thereby avoiding abrupt changes in delay time, which might otherwise cause undesired glitches on those critical DQS and DQ signals that are continuously running. However, embodiments of the present disclosure are not limited thereto, and the amount of adjustment in the delay may be larger than one delay tap, or may be determined by a different increment in the case of an adjustable delay line that did not use a chain of delay elements.

As noted above, in a case of an input/output circuit where multiple data bits DQ share a common clock or data strobe signal DQS, adjusting the DQS delay line may affect the timing margins in the sampling of all of the data signals DQ using the shared clock signal DQS. Accordingly, in some embodiments of the present disclosure, the delay line control logic accounts for the early indicator signal and late indicator signal assertions made for each of the data bits when determining the adjustments to the DQ delay settings and the DQS delay setting for the adjustable delay lines for DQ and the adjustable delay line for DQS.

As one example, in a case where the early-late detection circuit generates early indicator signals for multiple DQ signals or late indicator signals for multiple DQ signals (e.g., multiple signals are to be moved in the same direction), then the delay line control logic may control the delay setting on the adjustable delay line for DQS to be adjusted by one increment (e.g., one tap, or by a small incremental amount according to the adjustment behavior of the adjustable delay line) in the appropriate direction to address the violation of the early timing margin or late timing margin, rather than adjusting each of the DQ lines or adjusting the delay setting on the adjustable delay line for DQS by multiple taps (e.g., by one tap for each of the multiple DQ signals).

As another example, in some embodiments the delay line control logic may determine that the DQ delay settings and the DQS delay setting are both at extreme values that cancel one another out and may therefore incrementally adjust all of the DQ delay settings and the DQS delay setting to a more intermediate value to provide more flexibility or headroom for adjusting delay settings at a later time. This adjustment may be performed incrementally (e.g., one delay tap at a time) to reduce the possibility of instability (e.g., triggering other timing adjustments due to loss of timing margin). In some embodiments, the delay line control logic performs the analysis during normal operation (e.g., at 730 as shown in FIG. 7A).

Accordingly, aspects of embodiments of the present disclosure provide a method and apparatus for automatic tracking of voltage and temperature variation and calibrating delay lines on the fly without stopping the traffic. Moreover, it also provides techniques for a DVFS system to adjust voltage without stopping traffic while a fixed frequency operation is needed. Embodiments of the present disclosure provide more flexibility at the system level to better fine-tune its power/performance profile.

Figure 8:
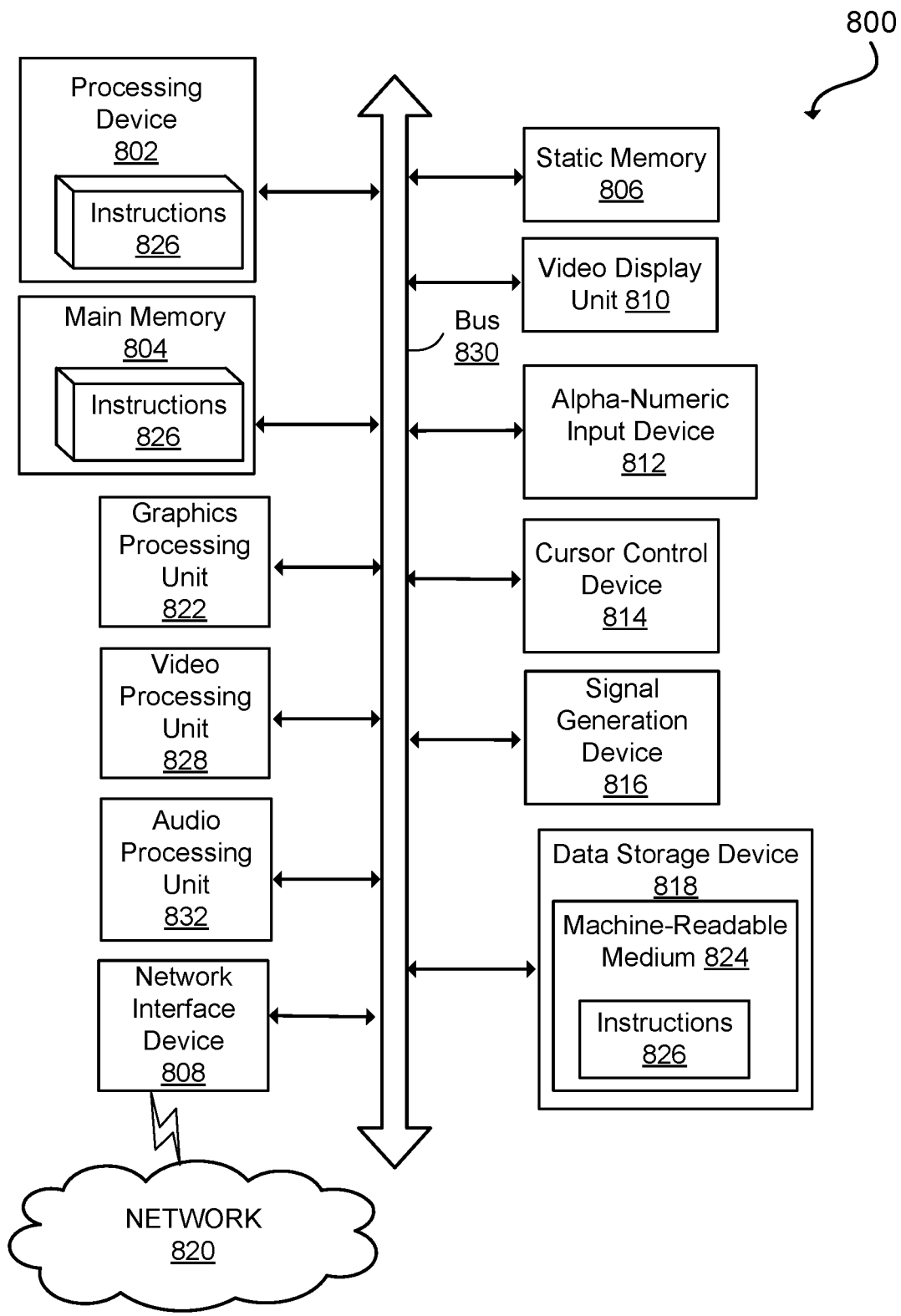
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media. Specifications for a circuit or electronic structure (which may also be referred to as "instructions, which when executed by a processor, cause the processor to generate a digital representation of the circuit or electronic structure") may range from low-level transistor material layouts to high-level description languages.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A circuit comprising:
   an early detection circuit connected to a data signal line and a clock signal line, the early detection circuit comprising:
      a first delay line configured to delay a data signal (DQ) received via the data signal line to generate a delayed data signal (DQ'); and
      a first phase detector configured to sample the data signal (DQ) and the delayed data signal (DQ') based on a clock signal (DQS) received from the clock signal line, the first phase detector being configured to output a first indicator signal in response to determining that an edge of the clock signal is before a desired point of a data eye of the data signal;
   a late detection circuit connected to the data signal line and the clock signal line, the late detection circuit comprising:
      a second delay line configured to delay the clock signal (DQS) received from the clock signal line to generate a delayed clock signal (DQS'); and
      a second phase detector configured to sample the data signal (DQ) based on the edge of the clock signal (DQS) and an edge of the delayed clock signal (DQS'), the second phase detector being configured to output a second indicator signal in response to determining that the edge of the clock signal (DQS) is after the desired point of the data eye of the data signal (DQ); and
   a delay line control logic configured to adjust one or more of a DQ adjustable delay line and a DQS adjustable delay line based on the first indicator signal and the second indicator signal to synchronize the data signal (DQ) and the clock signal (DQS).

2. The circuit of claim 1, wherein the first phase detector is configured to output the first indicator signal in response to determining that an early timing margin is violated in accordance with a delay setting of the first delay line of the early detection circuit, and
   wherein the second phase detector is configured to output the second indicator signal in response to determining a late timing margin is violated in accordance with a delay setting of the second delay line of the late detection circuit.

3. The circuit of claim 1, wherein the first phase detector comprises:
   a first sub-circuit configured to detect that a positive edge of the clock signal (DQS) is before the desired point of the data eye of the data signal (DQ); and
   a second sub-circuit configured to detect a negative edge of the clock signal (DQS) is before the desired point of the data eye of the data signal (DQ), and
wherein the second phase detector comprises:
   a first sub-circuit configured to detect that the positive edge of the clock signal (DQS) is after the desired point of the data eye of the data signal (DQ); and a second sub-circuit configured to detect that the negative edge of the clock signal (DQS) is after the desired point of the data eye of the data signal (DQ).

4. The circuit of claim 3, wherein the first sub-circuit of the first phase detector comprises:
a first D flip-flop and a second D-flip flop configured to detect that the positive edge of the clock signal (DQS) is before the desired point of the data eye of the data signal (DQ),
wherein the second sub-circuit of the first phase detector comprises: a third D flip-flop and a fourth D-flip flop configured to detect that the negative edge of the clock signal (DQS) is before the desired point of the data eye of the data signal (DQ),
wherein the first sub-circuit of the second phase detector comprises: a first D flip-flop and a second D-flip flop configured to detect that the positive edge of the clock signal (DQS) is after the desired point of the data eye of the data signal (DQ), and
wherein the second sub-circuit of the second phase detector comprises: a third D flip-flop and a fourth D-flip flop configured to detect that the negative edge of the clock signal (DQS) is after the desired point of the data eye of the data signal (DQ).

5. The circuit of claim 1, wherein the DQ adjustable delay line is connected to the data signal line and the DQS adjustable delay line is connected to the clock signal line, and
wherein the delay line control logic is configured to:
in response to determining that the second indicator signal is asserted and the first indicator signal is not asserted, respond to the second indicator signal assertion by:
determining whether a DQ delay line setting controlling the DQ adjustable delay line is at its maximum;
in response to determining that the DQ delay line setting controlling the DQ adjustable delay line is not at its maximum, increasing the DQ delay line setting by one increment;
in response to determining that the DQ delay line setting controlling the DQ adjustable delay line is at its maximum, determining whether a DQS delay line setting controlling the DQS adjustable delay line is at its minimum;
in response to determining that the DQS delay line setting is not at its minimum, decreasing the DQS delay line setting by one increment; and
in response to determining that the DQS delay line setting is at its minimum, retraining the DQ delay line setting and the DQS delay line setting; and
in response to determining that the first indicator signal is asserted and the second indicator signal is not asserted, respond to the first indicator signal assertion by:
determining whether a DQ delay line setting controlling the DQ adjustable delay line is at its minimum;
in response to determining that the DQ delay line setting controlling the DQ adjustable delay line is not at its minimum, decreasing the DQ delay line setting by one increment;
in response to determining that the DQ delay line setting controlling the DQ adjustable delay line is at its minimum, determining whether a DQS delay line setting controlling the DQS adjustable delay line is at its maximum;
in response to determining that the DQS delay line setting is not at its maximum, increasing the DQS delay line setting by one increment; and
in response to determining that the DQS delay line setting is at its maximum, retraining the DQ delay line setting and the DQS delay line setting.

6. The circuit of claim 1, wherein the DQ adjustable delay line is connected to the clock signal line and the DQS adjustable delay line is connected to the clock signal line, and
wherein the delay line control logic is configured to:
in response to determining that the second indicator signal is asserted and the first indicator signal is not asserted, respond to the second indicator signal assertion by:
determining whether a DQ delay line setting controlling the DQ adjustable delay line is at its minimum;
in response to determining that the DQ delay line setting controlling the DQ adjustable delay line is not at its minimum, decreasing the DQ delay line setting by one increment;
in response to determining that the DQ delay line setting controlling the DQ adjustable delay line is at its minimum, determining whether a DQS delay line setting controlling the DQS adjustable delay line is at its minimum;
in response to determining that the DQS delay line setting is not at its minimum, decreasing the DQS delay line setting by one increment; and
in response to determining that the DQS delay line setting is at its minimum, retraining the DQ delay line setting and the DQS delay line setting; and
in response to determining that the first indicator signal is asserted and the second indicator signal is not asserted, respond to the first indicator signal assertion by:
determining whether a DQ delay line setting controlling the DQ adjustable delay line is at its maximum;
in response to determining that the DQ delay line setting controlling the DQ adjustable delay line is not at its maximum, increasing the DQ delay line setting by one increment;
in response to determining that the DQ delay line setting controlling the DQ adjustable delay line is at its maximum, determining whether a DQS delay line setting controlling the DQS adjustable delay line is at its maximum;
in response to determining that the DQS delay line setting is not at its maximum, increasing the DQS delay line setting by one increment; and
in response to determining that the DQS delay line setting is at its maximum, retraining the DQ delay line setting and the DQS delay line setting.

7. The circuit of claim 1, comprising:
a plurality of early detection circuits comprising the early detection circuit, each of the early detection circuits being connected to a corresponding one of a plurality of data signal lines comprising the data signal line; and
a plurality of late detection circuits comprising the late detection circuit, each of the late detection circuits being connected to a corresponding one of the data signal lines,
wherein the clock signal line is shared by the data signal lines, and wherein the delay line control logic is further configured to adjust a plurality of DQ adjustable delay lines connected to a corresponding one of the data signal lines.

8. The circuit of claim 7, wherein the delay line control logic is configured to:
in response to detecting a plurality of first indicator signals from the plurality of early detection circuits, increase a DQS delay line setting controlling the DQS adjustable delay line; and
in response to detecting a plurality of second indicator signals from the plurality of late detection circuits, decrease the DQS delay line setting controlling the DQS adjustable delay line.

9. A method comprising:
receiving a data signal (DQ) and a clock signal (DQS);
generating an indicator signal by:
delaying the data signal (DQ) to generate a delayed data signal (DQ');
sampling the data signal (DQ) and the delayed data signal (DQ') using an edge of the clock signal (DQS) to generate a first sampled value and a second sampled value; and
generating the indicator signal based on the first sampled value and the second sampled value; and
adjusting one or more of a DQ adjustable delay line associated with the data signal (DQ) and a DQS adjustable delay line associated with the clock signal (DQS) based on the indicator signal to synchronize the data signal (DQ) and the clock signal (DQS).

10. The method of claim 9, wherein the sampling the data signal (DQ) and the delayed data signal (DQ') using an edge of the clock signal (DQS) to generate the first sampled value and the second sampled value comprises:
supplying the data signal (DQ), the delayed data signal (DQ'), and the clock signal (DQS) to a phase detector comprising:
a first phase detector comprising:
a first D flip-flop and a second D-flip flop configured to detect that a positive edge of the clock signal (DQS) is before a desired point of a data eye of the data signal (DQ); and
a third D flip-flop and a fourth D-flip flop configured to detect that a negative edge of the clock signal (DQS) is before the desired point of the data eye of the data signal (DQ), and
a second phase detector comprising:
a first D flip-flop and a second D-flip flop configured to detect that the positive edge of the clock signal (DQS) is after the desired point of the data eye of the data signal (DQ); and
a third D flip-flop and a fourth D-flip flop configured to detect that the negative edge of the clock signal (DQS) is after the desired point of the data eye of the data signal (DQ).

11. The method of claim 9, wherein the DQ adjustable delay line is connected to the data signal line and the DQS adjustable delay line is connected to the clock signal line, and
wherein adjusting the DQ adjustable delay line associated with the data signal (DQ) or a DQS adjustable delay line associated with the clock signal (DQS) based on the indicator signal to synchronize the data signal (DQ) and the clock signal (DQS) comprises:
in response to determining that the indicator signal is asserted, respond to the indicator signal assertion by:
determining whether a DQ delay line setting controlling the DQ adjustable delay line is at its minimum;
in response to determining that the DQ delay line setting controlling the DQ adjustable delay line is not at its minimum, decreasing the DQ delay line setting by one increment;
in response to determining that the DQ delay line setting controlling the DQ adjustable delay line is at its minimum, determining whether a DQS delay line setting controlling the DQS adjustable delay line is at its maximum;
in response to determining that the DQS delay line setting is not at its maximum, increasing the DQS delay line setting by one increment; and
in response to determining that the DQS delay line setting is at its maximum, retraining the DQ delay line setting and the DQS delay line setting.

12. The method of claim 11,
wherein the determining that the indicator signal is asserted comprises detecting the indicator signal is asserted for a plurality of consecutive cycles of the clock signal (DQS).

13. The method of claim 9, wherein the DQ adjustable delay line is connected to the clock signal line and the DQS adjustable delay line is connected to the clock signal line, and
wherein adjusting the DQ adjustable delay line associated with the data signal (DQ) or a DQS adjustable delay line associated with the clock signal (DQS) based on the indicator signal to synchronize the data signal (DQ) and the clock signal (DQS) comprises:
in response to determining that the indicator signal is asserted, respond to the indicator signal assertion by:
determining whether a DQ delay line setting controlling the DQ adjustable delay line is at its maximum;
in response to determining that the DQ delay line setting controlling the DQ adjustable delay line is not at its maximum, increasing the DQ delay line setting by one increment;
in response to determining that the DQ delay line setting controlling the DQ adjustable delay line is at its maximum, determining whether a DQS delay line setting controlling the DQS adjustable delay line is at its maximum;
in response to determining that the DQS delay line setting is not at its maximum, increasing the DQS delay line setting by one increment; and
in response to determining that the DQS delay line setting is at its maximum, retraining the DQ delay line setting and the DQS delay line setting.

14. The method of claim 9, further comprising generating the indicator signal based on a mismatch between the first sampled value and the second sampled value.

15. A non-transitory computer-readable medium having instructions stored thereon that, when executed by a processor, cause the processor to generate a digital representation of a circuit comprising:
a late detection circuit connected to a data signal line and a clock signal line, the late detection circuit comprising:
a delay line configured to delay a clock signal (DQS) received from the clock signal line to generate a delayed clock signal (DQS'); and
a phase detector configured to sample a data signal (DQ) received from the data signal line based on an edge of the clock signal (DQS) and an edge of the delayed clock signal (DQS'), the phase detector being configured to output an indicator signal in response to determining that the edge of the clock signal (DQS) is after a desired point of a data eye of the data signal (DQ); and a delay line control logic configured to adjust one or more of a DQ adjustable delay line connected to the data signal line and a DQS adjustable delay line connected to the clock signal line based on the indicator signal to synchronize the data signal (DQ) and the clock signal (DQS).

16. The non-transitory computer-readable medium of claim 15, wherein the phase detector is configured to output the indicator signal in response to determining a late timing margin is violated in accordance with a delay setting of the delay line of the late detection circuit.

17. The non-transitory computer-readable medium of claim 15, wherein the phase detector comprises:
a first D flip-flop and a second D-flip flop configured to detect that a positive edge of the clock signal (DQS) is after the desired point of the data eye of the data signal (DQ); and
a third D flip-flop and a fourth D-flip flop configured to detect that a negative edge of the clock signal (DQS) is after the desired point of the data eye of the data signal (DQ).

18. The non-transitory computer-readable medium of claim 15, wherein the DQ adjustable delay line is connected to the data signal line and the DQS adjustable delay line is connected to the clock signal line, and wherein the delay line control logic is configured to:
in response to determining that the indicator signal is asserted, respond to the indicator signal assertion by:
determining whether a DQ delay line setting controlling the DQ adjustable delay line is at its maximum;
in response to determining that the DQ delay line setting controlling the DQ adjustable delay line is not at its maximum, increasing the DQ delay line setting by one increment;
in response to determining that the DQ delay line setting controlling the DQ adjustable delay line is at its maximum, determining whether a DQS delay line setting controlling the DQS adjustable delay line is at its minimum;
in response to determining that the DQS delay line setting is not at its minimum, decreasing the DQS delay line setting by one increment; and
in response to determining that the DQS delay line setting is at its minimum, retraining the DQ delay line setting and the DQS delay line setting.

19. The non-transitory computer-readable medium of claim 15, wherein the DQ adjustable delay line is connected to the clock signal line and the DQS adjustable delay line is connected to the clock signal line, and wherein the delay line control logic is configured to:
in response to determining that the indicator signal is asserted, respond to the indicator signal assertion by:
determining whether a DQ delay line setting controlling the DQ adjustable delay line is at its minimum;
in response to determining that the DQ delay line setting controlling the DQ adjustable delay line is not at its minimum, decreasing the DQ delay line setting by one increment;
in response to determining that the DQ delay line setting controlling the DQ adjustable delay line is at its minimum, determining whether a DQS delay line setting controlling the DQS adjustable delay line is at its minimum;
in response to determining that the DQS delay line setting is not at its minimum, decreasing the DQS delay line setting by one increment; and
in response to determining that the DQS delay line setting is at its minimum, retraining the DQ delay line setting and the DQS delay line setting.

20. The non-transitory computer-readable medium of claim 15, wherein the digital representation of the circuit is included in a digital representation of an input/output circuit.

* * * * *